United States Patent [19]
Khater et al.

[11] Patent Number: 5,821,440
[45] Date of Patent: Oct. 13, 1998

[54] CABLE TRAY ASSEMBLY FOR TESTING DEVICE

[75] Inventors: Nabil Khater, San Jose, Calif.; David A. Baker, Hillsboro, Oreg.

[73] Assignee: Credence Systems Corporation, Fremont, Calif.

[21] Appl. No.: 846,350

[22] Filed: Apr. 30, 1997

[51] Int. Cl.[6] .................................................. G01D 21/00
[52] U.S. Cl. ............................................................. 73/866.5
[58] Field of Search ............................... 73/866.5, 865.9; 324/537, 754, 755, 765, 766–769, 500

[56] References Cited

U.S. PATENT DOCUMENTS 5,450,766  9/1995  Holt ........................................ 73/866.5

FOREIGN PATENT DOCUMENTS 406015584  1/1994  Japan ..................................... 73/866.5

Primary Examiner—Robert Raevis
Attorney, Agent, or Firm—Smith-Hill and Bedell

[57] ABSTRACT

A cable tray assembly for a manipulator within a testing device. A manipulator including cables is used for manipulating a testing head for testing semiconductor devices. The cable trays of the present invention are mounted within the manipulator within a cable housing and are mounted on respective rails allowing them to move longitudinally in and out with respect to the cable housing. The cable trays receive and support the cables that run from a frame of a tester system to the testing head. As the manipulator is moved to position the testing head, this causes the cables to move. In response, the cable trays independently move with the movement of the cables so as to allow for a full range of motion of the manipulator while simultaneously relieving compression and tension within the cables which reduces long term cable damage. The cable trays have a greater height with respect to their width so that the cables can more readily flex about an axis parallel to the cable tray height. The cable trays also contain a contoured flange at the bottom of each cable tray to prevent cable chafing. Further, the ends of the cable trays are tapered in length at different angles to maximize cable support while reducing cable tension during flexing. In one instance, three cable trays are used. As the cables are flexed in a direction toward a one cable tray, it moves inward to relieve cable compression as another cable tray on an opposite side moves outward to relieve cable tension.

24 Claims, 19 Drawing Sheets

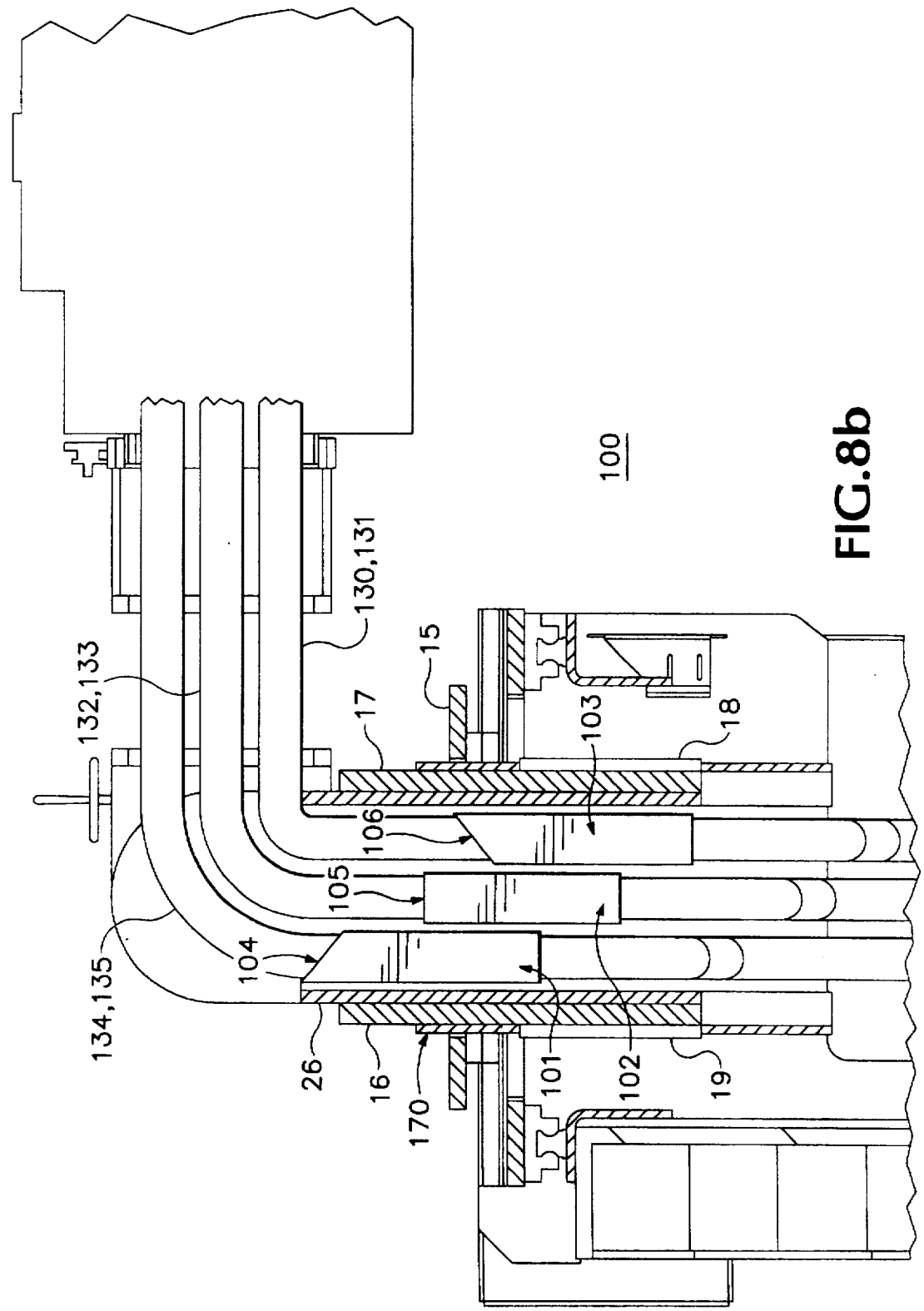

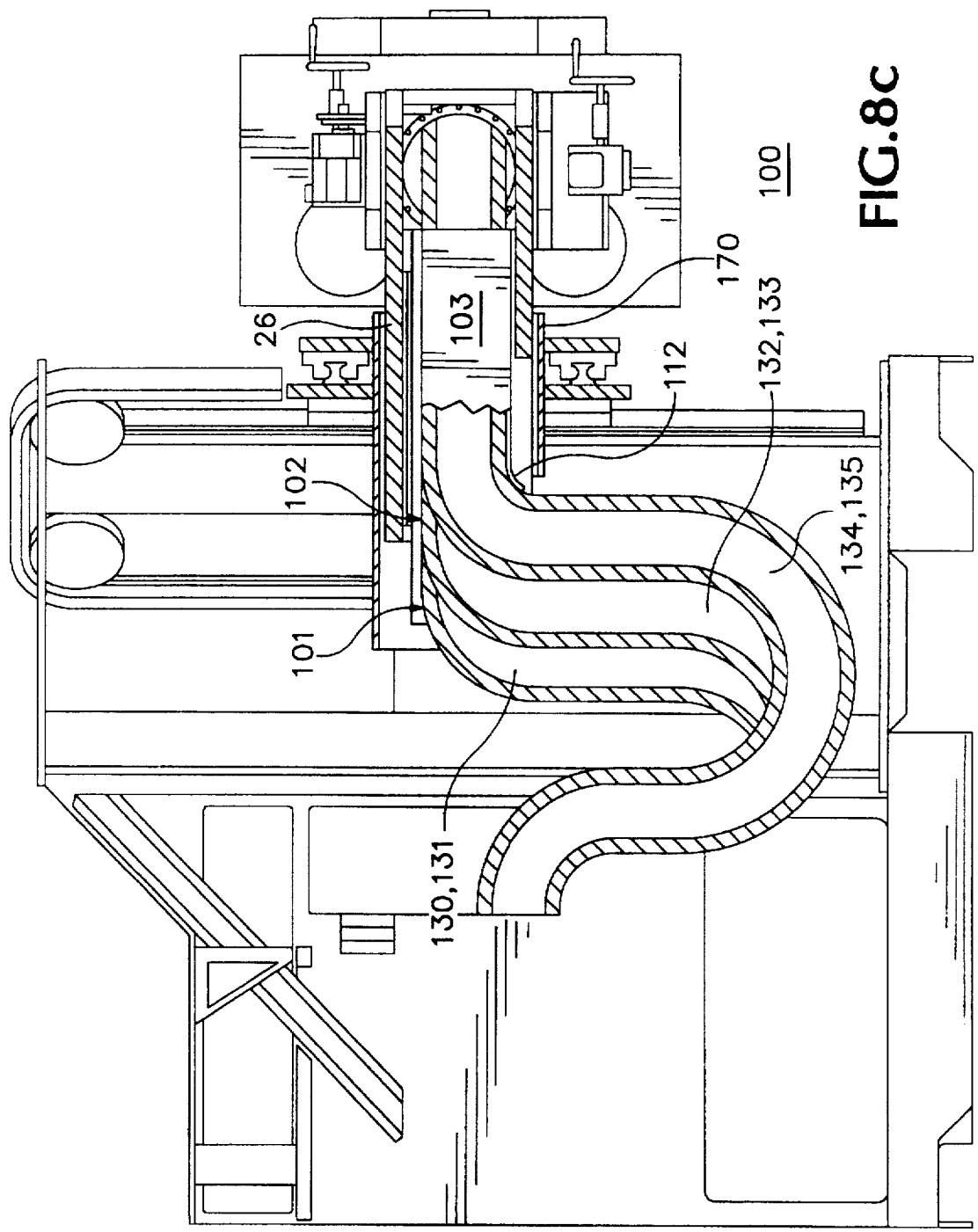

CABLE TRAY ASSEMBLY FOR TESTING DEVICE

TECHNICAL FIELD

The present claimed invention relates to the field of testing devices for electronic components. More specifically, the present invention relates to an improved cable handling system which includes cable trays that support cables which extend through a manipulator and connect to a testing head for testing of electronic components.

BACKGROUND ART

Prior art systems for testing electronic devices, and in particular, for testing semiconductor devices typically include electronic circuits, a frame, and a manipulator assembly which attaches to a testing head. The electronic circuits for testing are located in the testing head itself. However, some electronic circuits for processing and recording the testing data may be located within the frame or within a separate computer. A cable assembly consisting of multiple cables is used to provide power to the electronic circuits of the testing head and to connect the electronic circuits in the testing head to utilities such as power sources and to other devices (e.g., cooling systems, etc.). Since the testing process requires a large amount of power, large, heavy power cables are required to transfer the power from the power source to the testing head. Testing units that rely on pneumatic pressure to close electrical interface contacts include pneumatic tubing that couples high pressure air from a source to the testing head. In addition, due to the heat generated by the complex processing circuitry in the testing head, the testing head must be cooled. One way to cool the electronic components in the testing head is to circulate cooling fluids through the testing head. In testing devices that circulate cooling fluids, cables (water lines) conduct the cooling fluid from a heat exchanger to the testing head and return the spent (heated) cooling fluid to the heat exchanger.

Prior art manipulator assemblies use yokes which attach to opposite sides of a testing head. These prior art manipulator assemblies typically allow for horizontal motion by attaching an arm to a vertical rail. The arm attaches to the testing head using a yoke that attaches to opposite sides to the testing head. The arm is attached to the vertical rail such that the arm may move up and down along the vertical rail. The arm is typically attached such that the arm may pivot within a radial arc so as to allow for the movement of the yoke within a radial arc around the pivot point.

Due to the complexity of recent testers, cable assemblies typically include a large number of heavy, bulky cables. Typically, the individual cables of the cable assembly are bound together using a strap or a cable covering. Though this holds the cables together, the resulting cable assembly is quite heavy and bulky and the cable assembly has little flexibility. In prior art systems, the cable is commonly left lying on the ground as it extends from the testing head to the frame. Therefore, the large size cable typically interferes with positioning of the testing head when mating with a testing loader. Not only does the cable get in the way of operations, but also, the cable interferes with the motion of the manipulator and interferes with the motion of the testing head.

Recent designs have included cable handling systems that hold some of the cable up off of the ground using cable slings. However, though the position of the cable is controlled to some extent by the cable slings, the cable still gets in the way of operations and interferes with the motion of the arm and the testing head during positioning. In addition, attempts to move prior art arms within a wide arc put stress and strain on the cables, thereby damaging the cables.

This problem is particularly apparent in prior art designs in which the cable is either disposed on the ground or within a sling such that it runs along the side of the frame. Though the cable may move across the ground or swing within the sling so as to allow for motion of the arm along an arc towards the opposite side of the frame from the side that the cable extends across, when the arm swings to the side of the frame that the cable extends across, the cables prevent full movement. If the operator attempts to force the manipulator towards the side of the frame that the cable extends across, the cable is bent into a loop and may be compressed so as to damage or break the cables.

Other prior art designs have placed the cable through the center of the housing. However, the cable is large and heavy and relatively inflexible. Therefore, though the cable may move within an equal range to each side, the range of movement is limited by the cables inability to flex. Thus, though designs that extend the cable through the center of the tester allow for more versatility than do designs that run the cable across the side of the frame, the designs still do not accommodate the needs of many assembly room layouts. In particular, some manufacturers test with the testing head forward which is typically referred to as device under testing (DUT) forward. Other manufacturers test in the DUT up position (where the device to be tested is placed over the testing head) and the DUT down position (where the device to be tested is placed below the testing head). In order to fully accommodate all of these testing positions and space requirements, a flexible cable support system is needed.

Another recent improvement has been the incorporation of "twist" into the manipulator design. Prior art designs which allow for "twist" allow for rotary motion between the arm and the testing head. This allows the yoke and the testing head to rotate. However, the heavy cables of the cable assembly make movement difficult and limit the range of movement by twist.

What is needed is a cable handling system that provides for placement of the cables such that they are not in the way of the operator and such that the cables do not interfere with the movement of the manipulator and test head. Furthermore, a cable handling system is needed that limits compression and tension of the cables resulting from movement of the manipulator so as to prevent damage to the cables. What is needed yet is a tester design which includes a manipulator with such a cable handling system which will allow for a full range and ease of movement. The present invention provides a solution to the above needs.

DISCLOSURE OF THE INVENTION

The present invention meets the above needs with a improved cable handling system which allows a manipulator to move within a full range of motion. The cable trays of the present invention are mounted within the manipulator within a cable housing and are mounted on respective rails allowing them to move longitudinally in and out with respect to the cable housing. The cable trays receive and support the cables that run from a frame of a tester system to the testing head. As the manipulator is moved to position the testing head this causes the cables to move. In response, the cable trays independently move with the movement of the cables so as to allow for a full range of motion of the manipulator while simultaneously relieving compression and tension within the cables which reduces long term cable damage. The cable trays have a greater height with respect to their width so that the cables can more readily flex about an axis parallel to the cable tray length (their major axis). The cable trays also contain a contoured flange at the bottom of each cable tray to prevent cable chafing. Further, the ends of the cable trays are tapered in length in different angles to maximize cable support while reducing cable tension during flexing. In one instance, three cable trays are used. As the cables are flexed in a direction toward a one cable tray, it moves inward to relieve compression as another cable tray on an opposite side moves outward to relieve tension.

Specifically, the cables extend through the frame and into cable trays that are located within an expansion joint. The cables extend through the expansion joint and along the longitudinal axis of a swing arm which rotates through a wide range of swing motion. The expansion joint allows for the extension and retraction of the swing arm. The cable extends across an assembly that allows for tumble rotation and through a rotary bearing assembly which provides a wide range of twist motion. The cable trays move longitudinally so as to allow the manipulator to move within a full range of motion without damage to the cables. The longitudinal motion of the cable trays provides cable extension and retraction as needed by the movement of the manipulator. The improved cable handling system of the present invention also provides for the storage of excess cable.

Three cable trays are disposed within the cable housing. Each of the cable trays is attached to a longitudinally oriented rail disposed within the cable housing by a bearing assembly such that each cable tray may move back and forth within the cable housing. Each cable tray includes a contoured flange which extends from one end of the cable tray so as to prevent chafing of the cable as the cable extends from the end of the cable tray into a loop. The height and width of each of the cable trays are designed to minimize tension and compression of the cables as the cables are flex horizontally. In addition, the front end of each cable tray has either a straight profile or an angled profile so as to minimize tension and compression in the cable as the cable is flexed horizontally and so as to allow for the fullest possible range of cable movement and manipulator movement.

The improved cable handling system of the present invention allows the cables to move within the manipulator so as to allow for a broader range of motion of the manipulator than that of prior art manipulators. In particular, in the present invention, the manipulator moves horizontally, vertically and with respect to tumble and twist. The cable handling system accommodates all of these movements and minimizes compression and tension in the cables. A tester that includes a manipulator housing the cable trays that allows for a full range of motion is also described.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 8b shows a top cross sectional view along axis C—C of FIG. 4 illustrating an expanded view of a tester including a cable trays and cables with a manipulator in a DUT up position with a swing arm having 90 degrees of swing rotation to the left and an expansion joint in the fully expanded position in accordance with the present invention.

FIG. 8c shows a schematic side cross sectional view illustrating an expanded view of a tester including a cable trays and cables with a manipulator in a DUT up position with a swing arm having 90 degrees of swing rotation to the right and an expansion joint in the fully expanded position in accordance with the present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
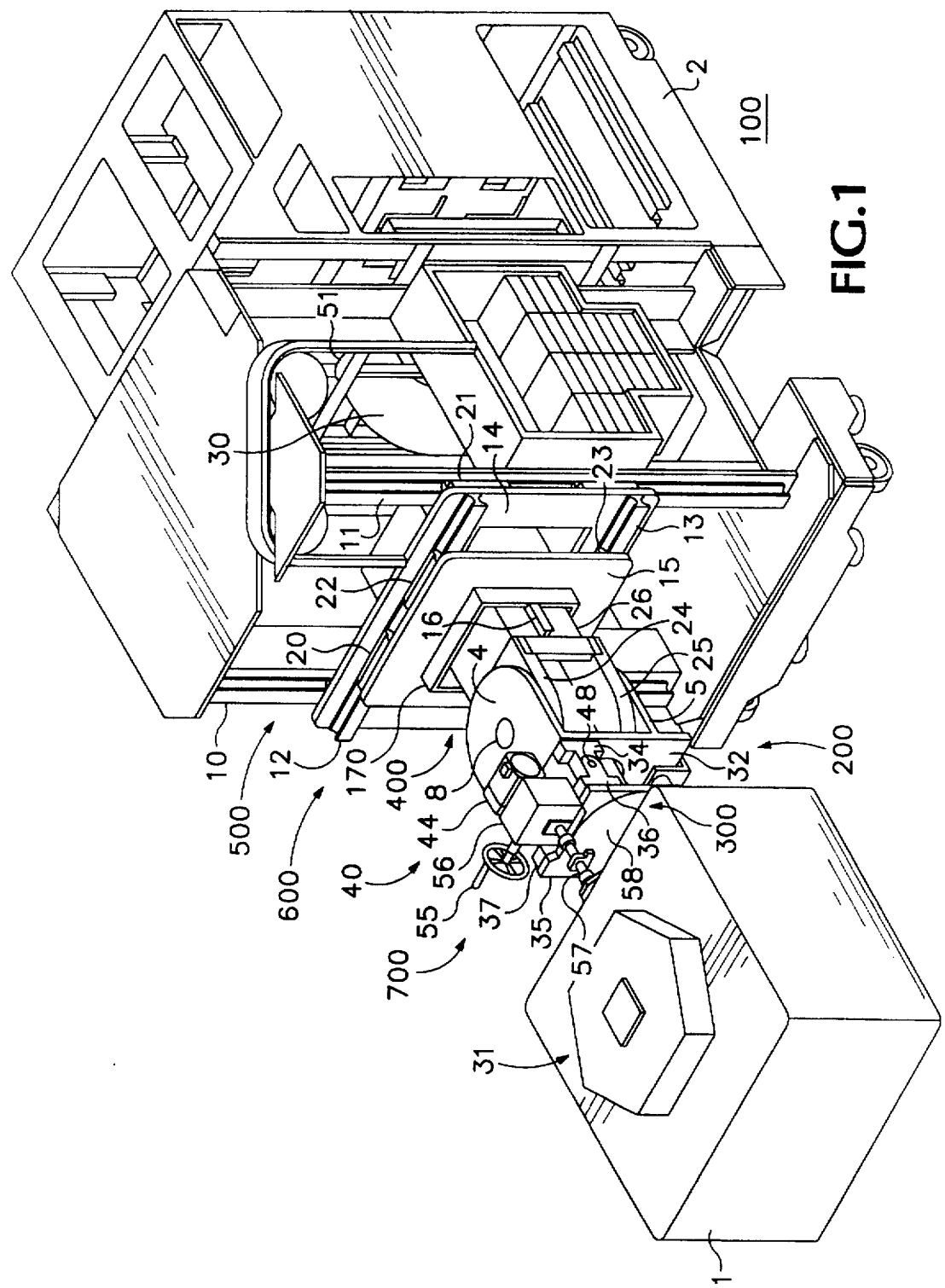
FIG. 1 is a front perspective view illustrating a tester including a manipulator in a DUT up position with a swing arm having 0 degrees of swing rotation in accordance with the present invention.

FIG. 1 shows tester 100 to include cable 30 which couples test head 1 to external devices and to power supply sources and to plumbing for cooling and pressure testing. Tester 100 also includes frame 2 to which manipulator 200 is attached. Manipulator 200 allows test head 1 to be moved within a broad range of motion such that testing surface 31 may be moved to accommodate a wide range of testing configurations. Frame 2 includes cable coupling 51 which secures cable 30 to frame 2. Cable 30 is sufficiently long and has slack to accommodate lateral extension of manipulator 200. When manipulator is in the retracted position, excess cable from cable 30 is stored in a loop within frame 2. This loop allows manipulator 200 to be laterally extended and retracted. When manipulator 200 is in the fully retracted position, the loop is at its maximum size, with the loop growing smaller as manipulator 200 is extended into the fully extended position. In the fully extended position, cable 30 is fully extended into manipulator 200 and the loop is eliminated. Manipulator 200 includes vertical rail assembly 500 which includes vertical rails 10–11 which are attached to frame 2 and vertical bearing assemblies 20–21. Vertical rail 10 receives vertical bearing assembly 20 and vertical rail 11 receives vertical bearing assembly 21 so as to allow vertical rail plate 14 to move smoothly up and down with respect to frame 2. Horizontal rail assembly 600 includes horizontal rails 12–13 which are connected to vertical rail plate 14. Horizontal rail assembly 600 also includes upper horizontal bearing assembly 22 and lower horizontal bearing assembly 23. Horizontal movement is provided by the engagement of upper horizontal bearing assembly 22 with horizontal rail 12 and the engagement of lower horizontal bearing assembly 23 with horizontal rail 13. Upper horizontal bearing assembly 22 and lower horizontal bearing assembly 23 are attached to horizontal rail plate 15 so as to allow horizontal rail plate 15 to move horizontally with respect to vertical rail plate 14. In one embodiment, vertical rails 10–11 have a length sufficient so as to allow for 73 inches of vertical movement. Upper horizontal rail 12 and lower horizontal rail 13 have lengths sufficient so as to allow horizontal rail plate 15 to move a total of 8 inches horizontally. Support box 170 is attached to horizontal rail plate 15.

Cable housing 26 of FIG. 1 is secured to support box 170 by lateral rails 16–17 and lateral bearing assemblies 18–19 (not shown) so as to allow cable housing 26 to extend and retract laterally. Lateral rails 16–17 are sufficiently long so as to allow for cable housing 26 to be extended a total of 6 inches. Extending from the top and bottom sides of cable housing 26 are upper cable housing flange 24 and lower cable housing flange 25. Swing arm 40 includes upper swing coupling flanges 4 and lower swing coupling flange 5. Pivot pin 8 engages an opening in upper cable housing flange 24 and a corresponding opening in upper swing coupling flange 4. Pivot pin 9 engages an opening in lower cable housing flange 25 and a corresponding opening in lower swing coupling flange 5. The engagement of pivot pins 8–9 with upper cable housing flange 24 and lower cable housing flange 25 and upper swing coupling flange 4 and lower swing coupling flange 5 attaches cable housing 26 to swing arm 40 such that swing arm 40 may rotate.

Swing arm 40 of FIG. 1 freely rotates with respect to cable housing 26 a full ninety degrees to each side. Swing arm 40 is shown to include swing plate 32 and tumble brackets 33–34. Swing arm 40 attaches to tumble plate 35 via pins 47–48 which couple tumble flanges 36–37 to tumble brackets 33–34.

Figure 2:
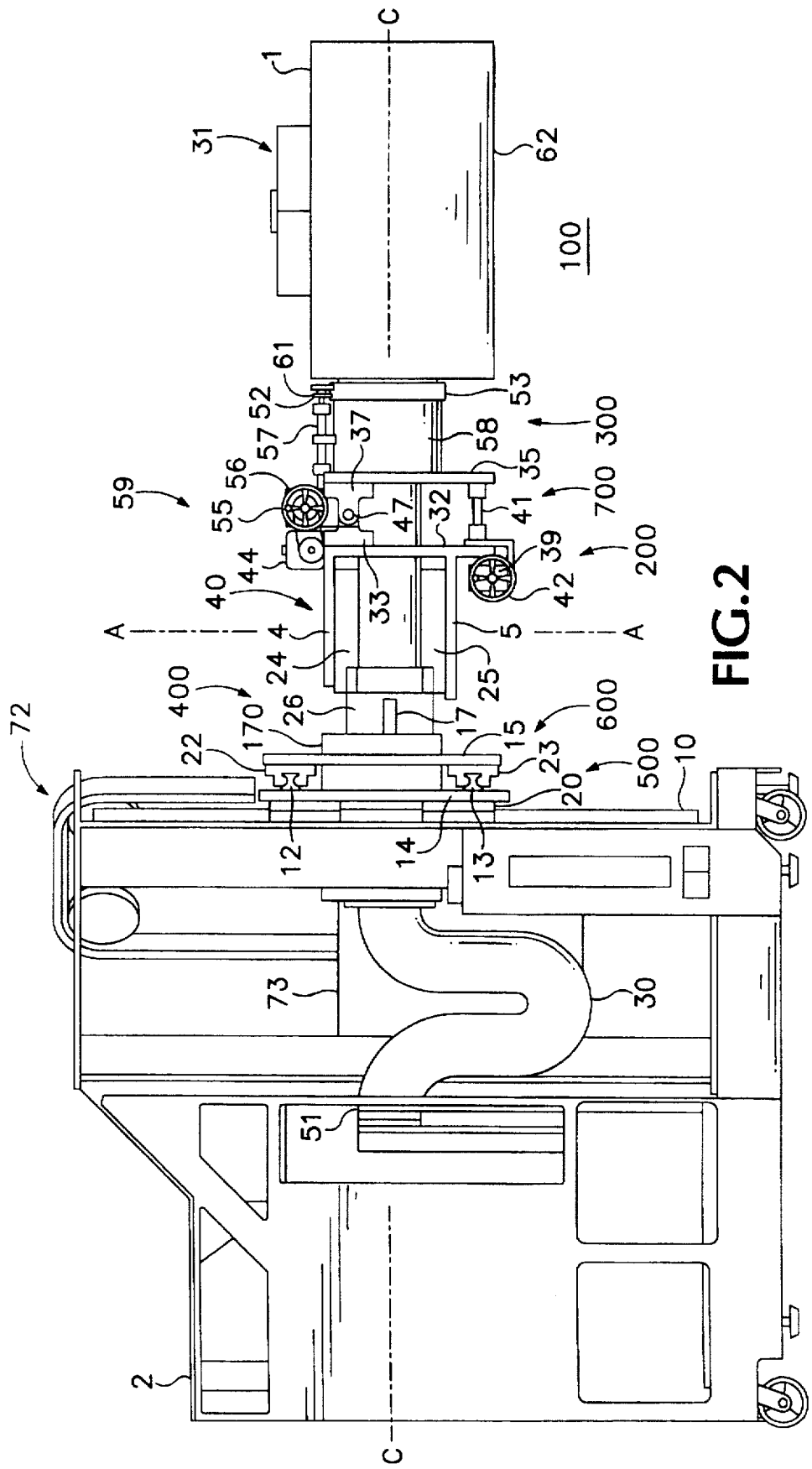
FIG. 2 is a right side view illustrating a tester including a manipulator in a DUT up position with a swing arm having 0 degrees of swing rotation in accordance with the present invention.

FIG. 2 shows a side view of tester 100 when cable housing 26 is in the fully retracted position. It can be seen that the profile of the manipulator 200 is streamlined. That is, the various components that allow test head 1 to be positioned do not add an excess of length to tester 100. This is significant since test head 1 is quite heavy. Thus, the longer the manipulator, the more weight that must be designed into the frame to counterbalance the weight of head 1. This streamlined length is in part due to the design of vertical rail assembly 500 and horizontal rail assembly 600. Horizontal rail assembly 600 includes horizontal rails 12–13 and horizontal bearing assemblies 22–23. Vertical rail assembly 500 includes vertical rails 10–11 and vertical bearing assemblies 20–21. The bearings of horizontal bearing assemblies 22–23 and vertical bearing assemblies 20–21 engage the sides of horizontal rails 12–13 and vertical rails 10–11. This design minimizes the length of the component parts. Preferably, each of rail assemblies 500, 600 incorporates the use of accu-glide bearings for smooth and uniform movement. Accu-glide bearings are used because they allow for higher speeds, they have a lower coefficient of friction, they allow for uniform loading of bearings and they have a lower profile than prior art bearing assemblies. Accu-glide bearing assemblies are manufactured by Thompson Bay Company, Inc. of Port Washington, N.Y. Incorporated into each of horizontal rail assembly 600 and vertical rail assembly 500 are locking screws so as to allow for locking each of horizontal rail assemblies 600 and vertical rail assemblies 500 in place once they are properly positioned.

Cable housing 26 of FIG. 2 couples to support box 170 such that cable housing 26 may move laterally. Cable housing 26 couples to swing arm 40 by pivot pins 8–9 such that swing arm 40 may pivot about axis A—A a full ninety degrees to each side.

Figure 3:
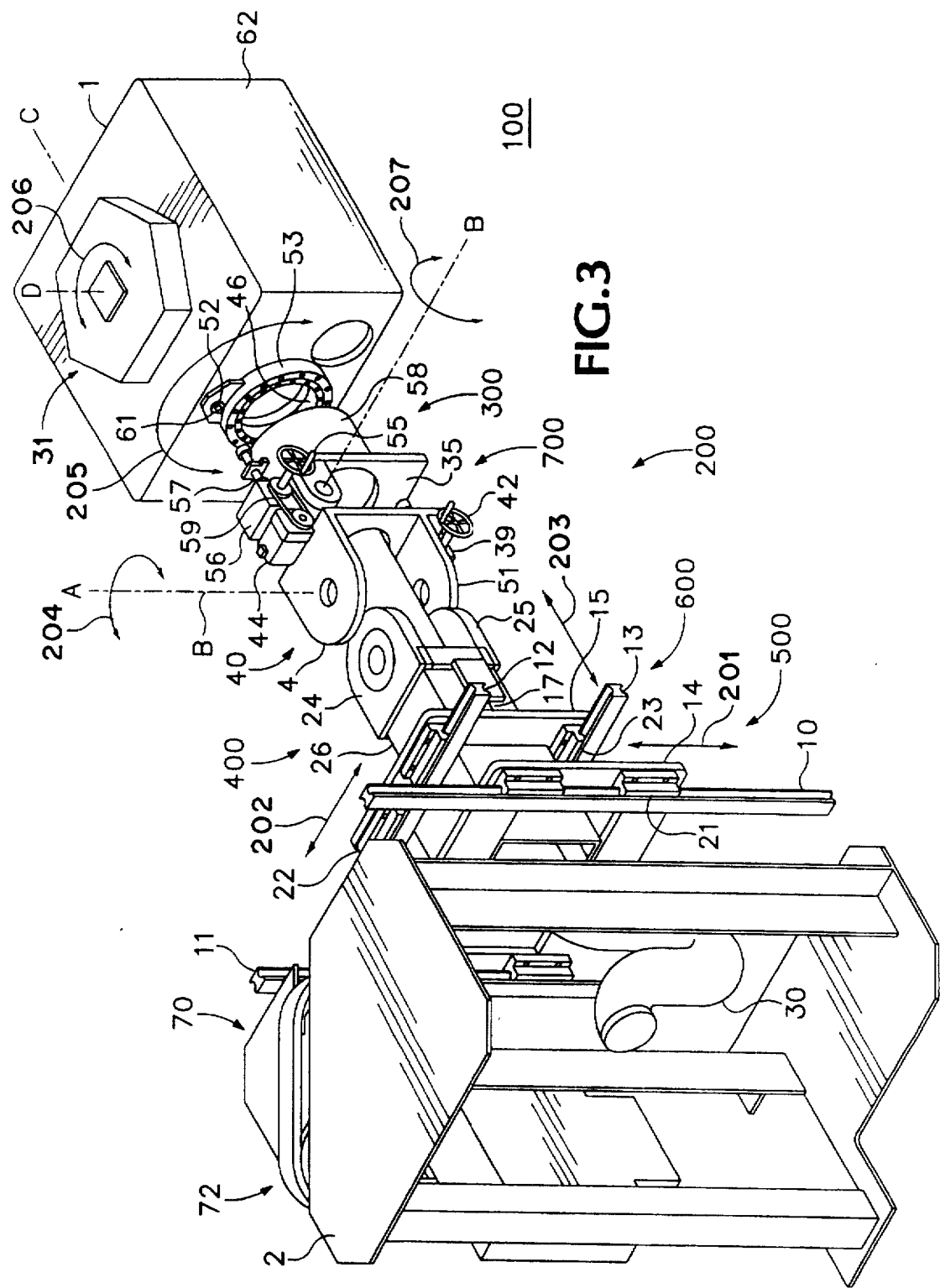
FIG. 3 is a left side view illustrating a expanded view of a tester including a manipulator in a DUT up position with a swing arm having 0 degrees of swing rotation in accordance with the present invention.

When swing arm 40 of FIG. 2 is in the 0 degree of swing position, tumble motion is provided by movement of tumble assembly 700 which includes pivot pins 47–48 and tumble control screw 41. Rotation about the centerline of pins 47–48, referred to as rotation about tumble axis B—B of FIG. 3, is controlled by tumble control screw 41 of FIG. 2 which is operated by manual movement of tumble control screw handle 42. Tumble control screw handle 42 operates gears 39 that rotate tumble control screw 42 so as to move tumble plate 35.

When the swing arm 40 of FIG. 2 is in the 0 degree of swing position and when tumble rotation is 0 degrees, twist rotation is obtained by rotation of rotary bearing assembly 300. Rotary bearing assembly 300 includes head flange 46 of FIG. 3 and twist flange 53. Twist flange 53 is attached to mounting flange 58. Head flange 46 of FIG. 3 is connected to test head 1 and test head frame 62. Rotary bearings 54 of FIG. 4 couple head flange 46 to twist flange 53 such that head flange 46 may freely rotate with respect to twist flange 53 about axis C—C of FIG. 3 which runs through the center of rotary bearing assembly 300. Test head 1 includes test head frame 62 which is attached to head flange 46 such that test head 1 rotates with the rotation of head flange 46. Twist control motor 44 rotates the gears in gearbox 56 so as to provide rotation to shaft 57. Twist control motor 44 is coupled to gearbox 56 by belt assembly 59. Shaft 57 rotates sprocket 61 which rotates chain 52. Chain 52 extends around head flange 46 so as to rotate head flange 46. Head flange 46 is coupled to test head frame 62 such that test head frame 62 and test head 1 rotate with the rotation of head flange 46. Twist control motor 44 is an electric motor which operates at two speeds, slow and fast and which is operated by a control pad that couples to twist control motor 44. In addition to motorized twist operation, manual operation is obtained by rotating wheel 55 so as to operate gearbox 56. This allows for the position of head 1 to be adjusted both manually and electrically as required to properly position test head 1 as needed. Testing surface 31 is coupled to test head frame 62 such that it may rotate within a narrow range.

The ranges of rotational motion provided by manipulator 200 of FIG. 3 include rotation around axis A—A, axis B—B, axis C—C, and axis D—D. Swing arm 40 pivots around axis A—A so as to allow for swing motion as illustrated by arrow 204. When swing arm 40 has 0 degrees of rotation about axis A—A, tumble motion is provided for by movement of tumble assembly 700 about axis B–B as shown by arrow 209. When swing arm 40 has 0 degrees of rotation about axis A—A, head flange 46 and test head 1 rotate about axis C—C so as to provide twist motion as shown by arrow 205. Further control is provided by theta motion which results from the rotation of testing surface 31 along axis D—D as shown by arrow 206. Linear motion of test head 1 is provided by vertical motion as shown by arrow 201 and horizontal motion as shown by arrow 202 and lateral motion as shown by arrow 203.

Figure 4:
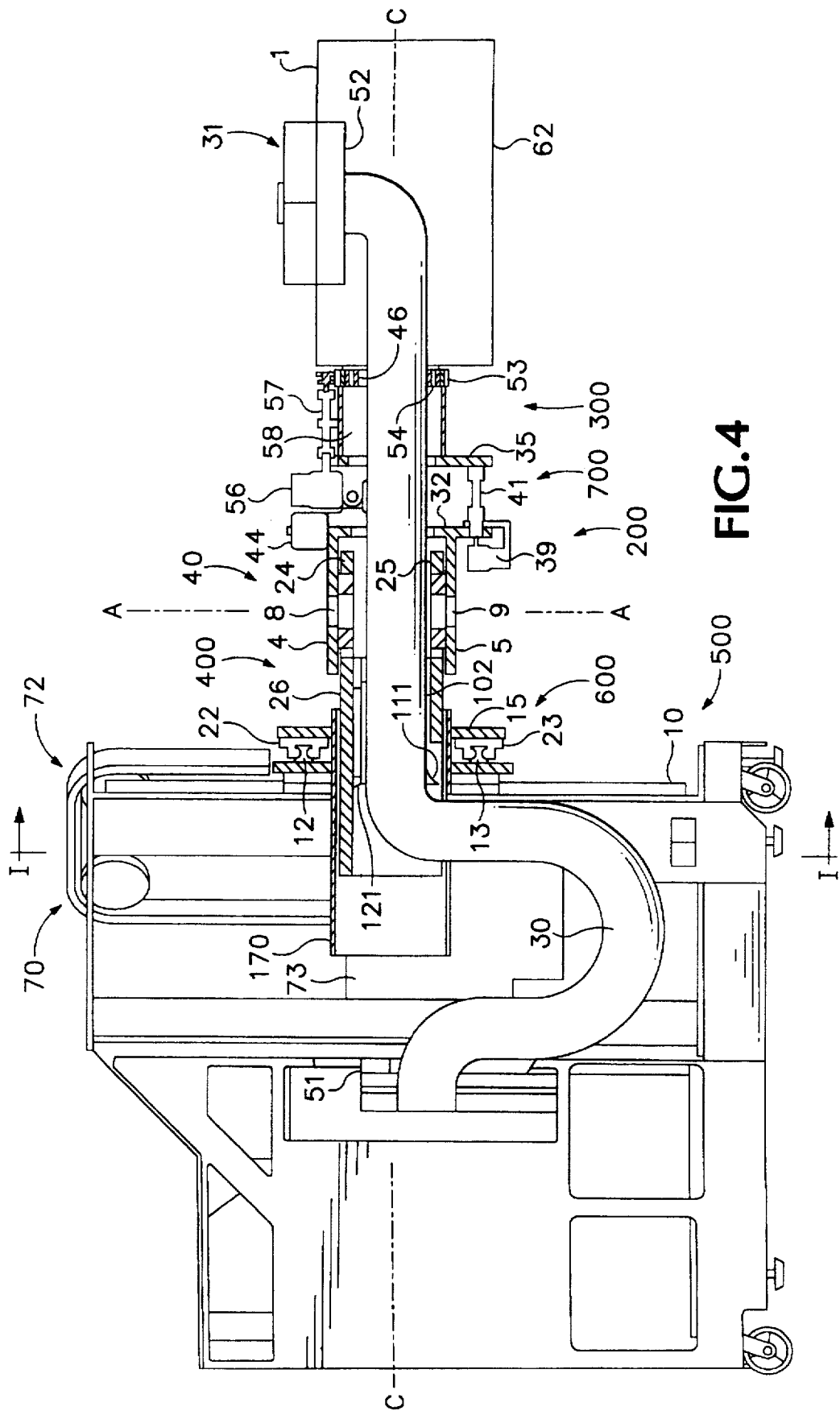
FIG. 4 is a left side cross sectional view along axis C—C of FIG. 3 illustrating a tester including a manipulator in a DUT up position with a swing arm having 0 degrees of swing rotation in accordance with the present invention.

FIG. 4 shows cables 30 to extend through manipulator 200 and into head 1. Within head 1, cables 30 connect to electronic circuits 52 which couple to testing surface 31. Some of cables 30 are supported by cable tray 102 which includes contoured flange 111. Counterbalance system 70 includes weight 73 and cable-and-pulley system 72 which is coupled to vertical rail plate 14. Counterbalance system 70 applies force to vertical rail plate 14 so as to compensate for the heavy weight of cable 30, manipulator 200 and test head 1 so as to allow for the easy movement of manipulator 200 vertically.

FIGS. 9–12 illustrate the range of motion provided by the present invention with reference to a standard x-y-z coordinate system. The freedom of movement of the present invention allows for expanded motion with respect to horizontal, vertical, twist and tumble motion. Expansion and contraction of expansion joint 400 constitutes movement along the x axis. Movement of vertical rail assembly 500 allows for motion along the y axis and movement of horizontal rail assembly 600 allows for movement along the z axis.

Figure 9:
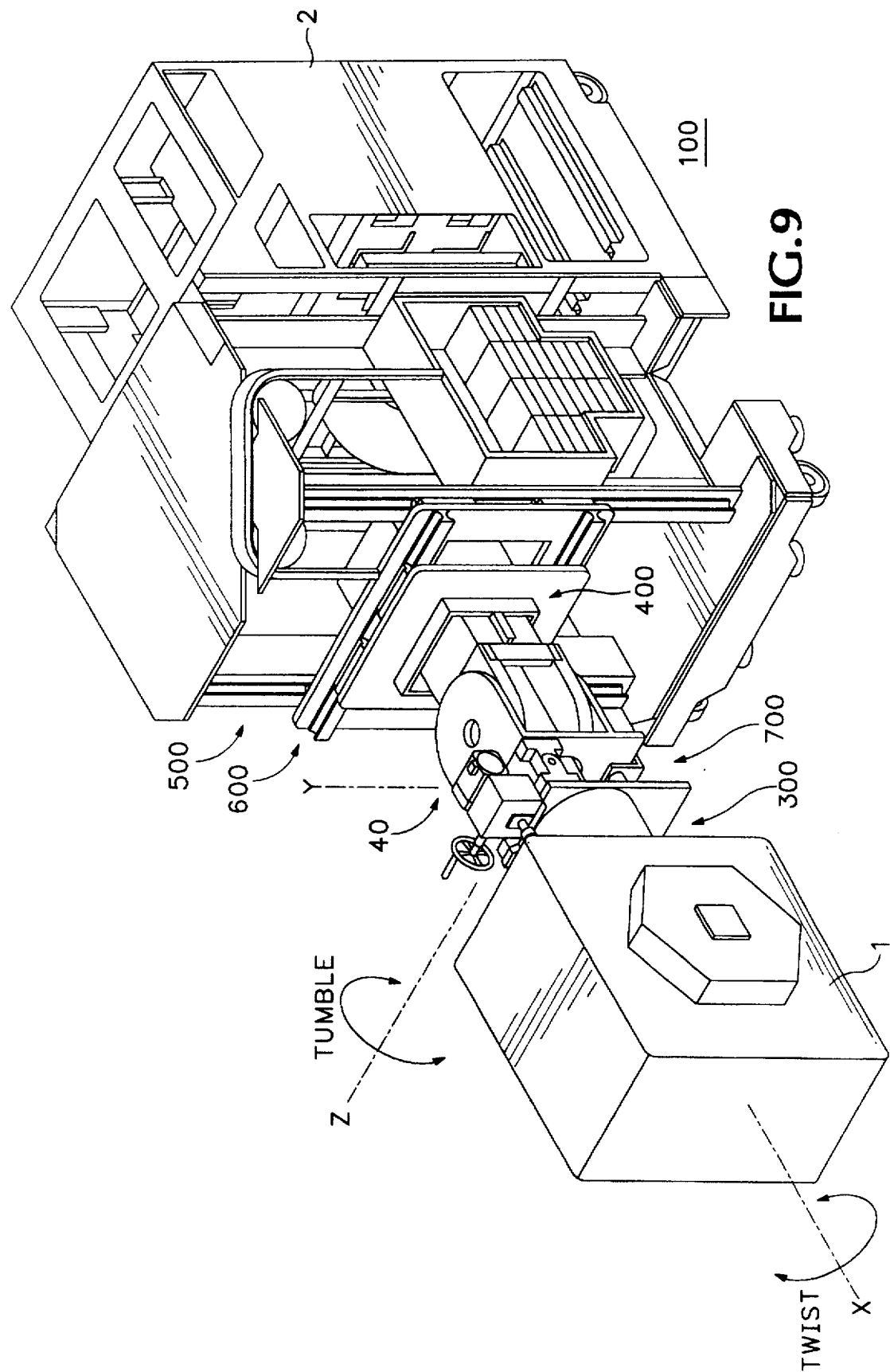
FIG. 9 is a perspective view illustrating a tester with a manipulator in a DUT side position with a swing arm having 0 degrees of swing rotation and an expansion joint in the fully expanded position and a rotary bearing assembly having 90 degrees of twist rotation in accordance with the present invention.
Figure 10:
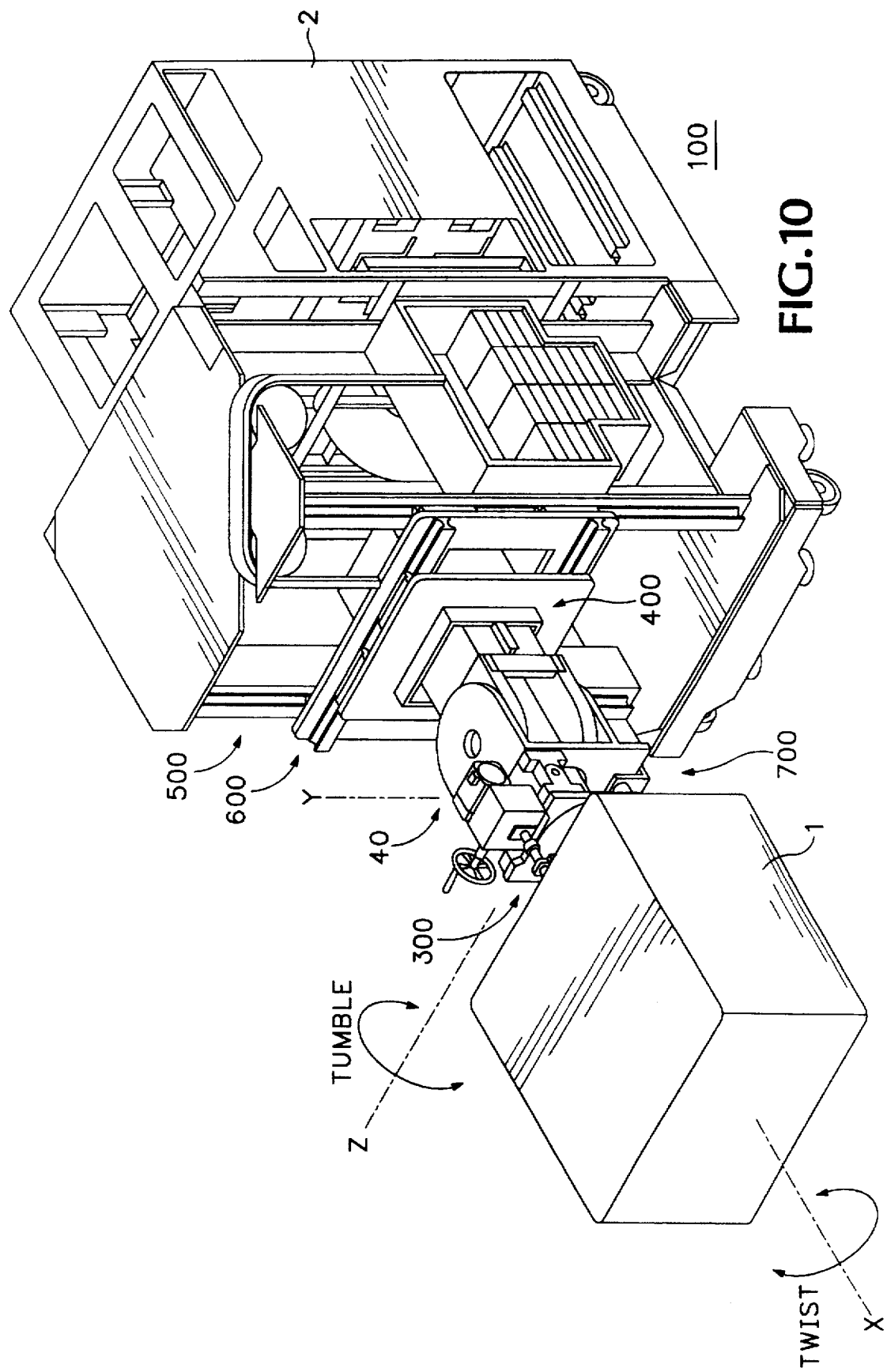
FIG. 10 is a perspective view illustrating a tester with a manipulator in a DUT down position with a swing arm having 0 degrees of swing rotation and an expansion joint in the fully expanded position and a rotary bearing assembly having 180 degrees of twist rotation in accordance with the present invention.

FIGS. 9–10 show positions illustrating swing arm 40 rotated with 0 degrees of swing such that the longitudinal axis of swing arm 40 extends along the x axis. In this position, rotation of rotary bearing assembly 300 provides rotation about the x axis, commonly referred to as "twist" rotation and rotation of tumble assembly 700 provides rotation about the z axis, commonly referred to as "tumble" rotation.

FIG. 9 shows tester 100 in a position suitable for DUT side testing. This DUT side testing position may be obtained by rotating rotary bearing assembly 300 so as to apply 90 degrees of rotation to rotary bearing assembly 300. FIG. 10 shows tester 100 in a position suitable for DUT down testing. This DUT down testing position may be obtained by rotation of rotary bearing assembly 300 so as to apply 180 degrees of rotation to rotary bearing assembly 300. In FIGS. 9–10, movement of the tumble assembly 700 allows for motion along the z axis and along the y axis such that the user may fully compensate for sag by movement of tumble assembly 700.

Figure 11:
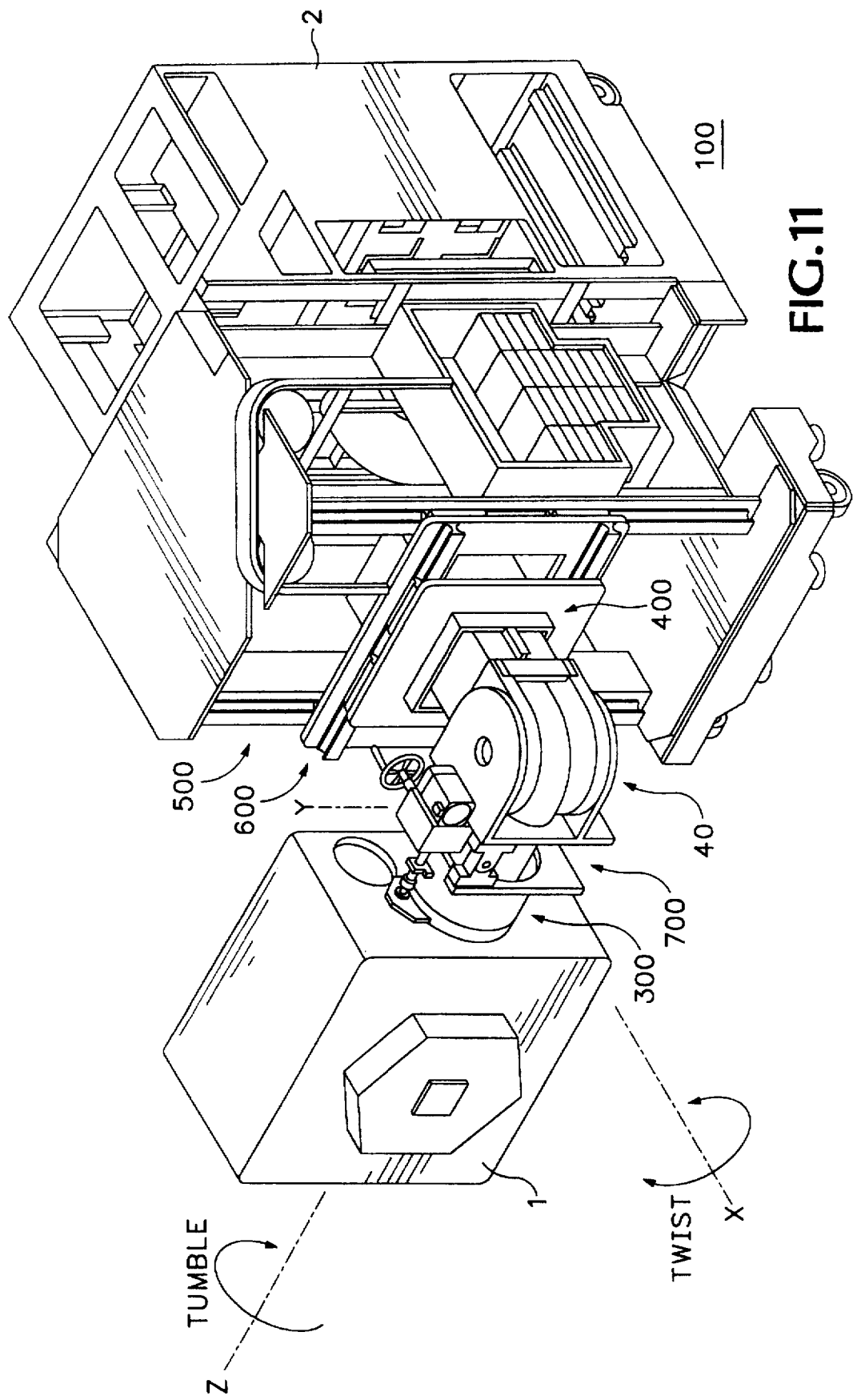
FIG. 11 is a perspective view illustrating a tester with a manipulator in a DUT side position with a swing arm having 90 degrees of swing rotation and an expansion joint in the fully expanded position and a rotary bearing assembly having 90 degrees of tumble rotation in accordance with the present invention.
Figure 12:
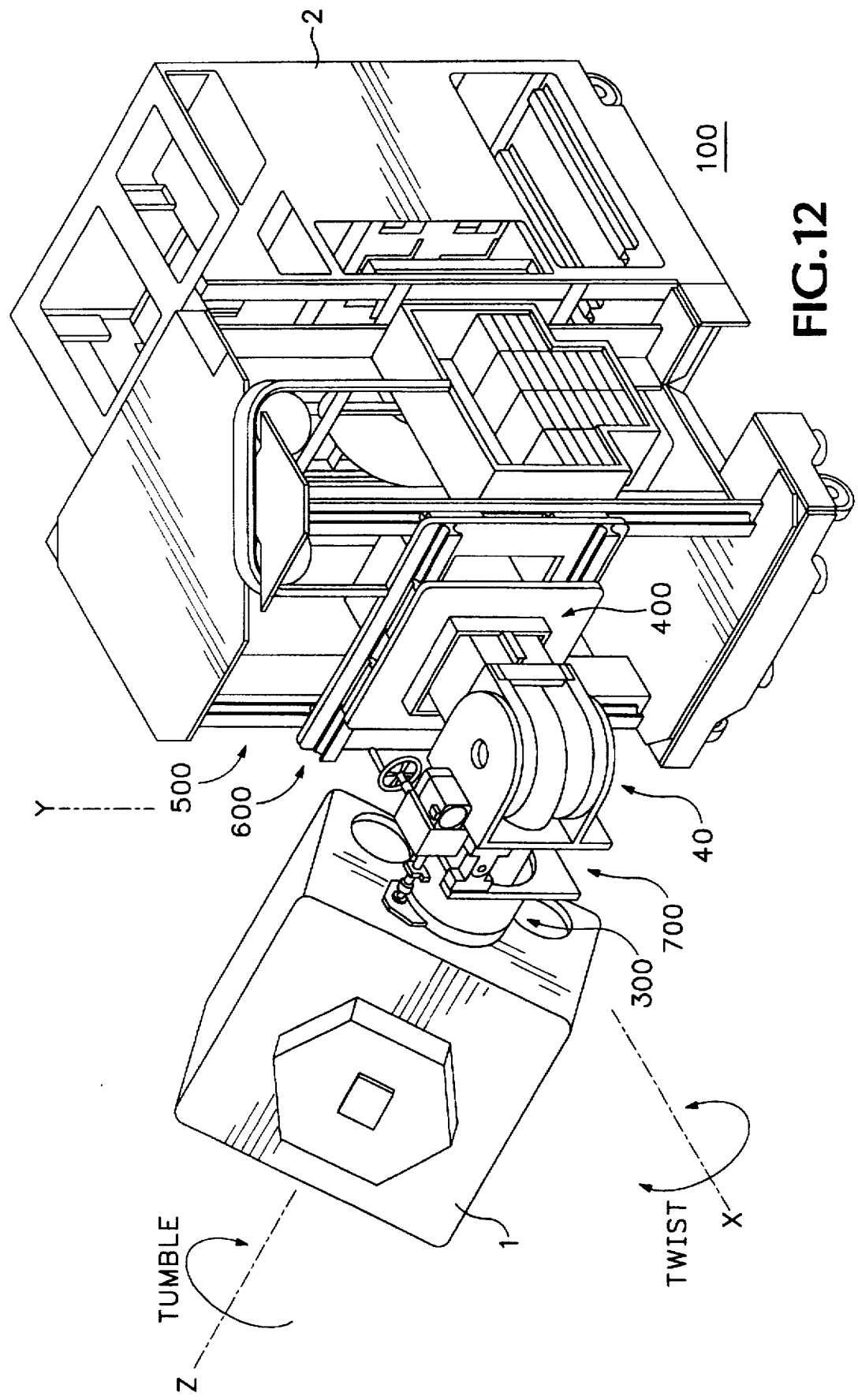
FIG. 12 is a perspective view illustrating a tester with a swing arm having 90 degrees of swing rotation to the left and an expansion joint in the fully expanded position and a rotary bearing assembly having 45 degrees of tumble rotation in accordance with the present invention.
Figure 13:
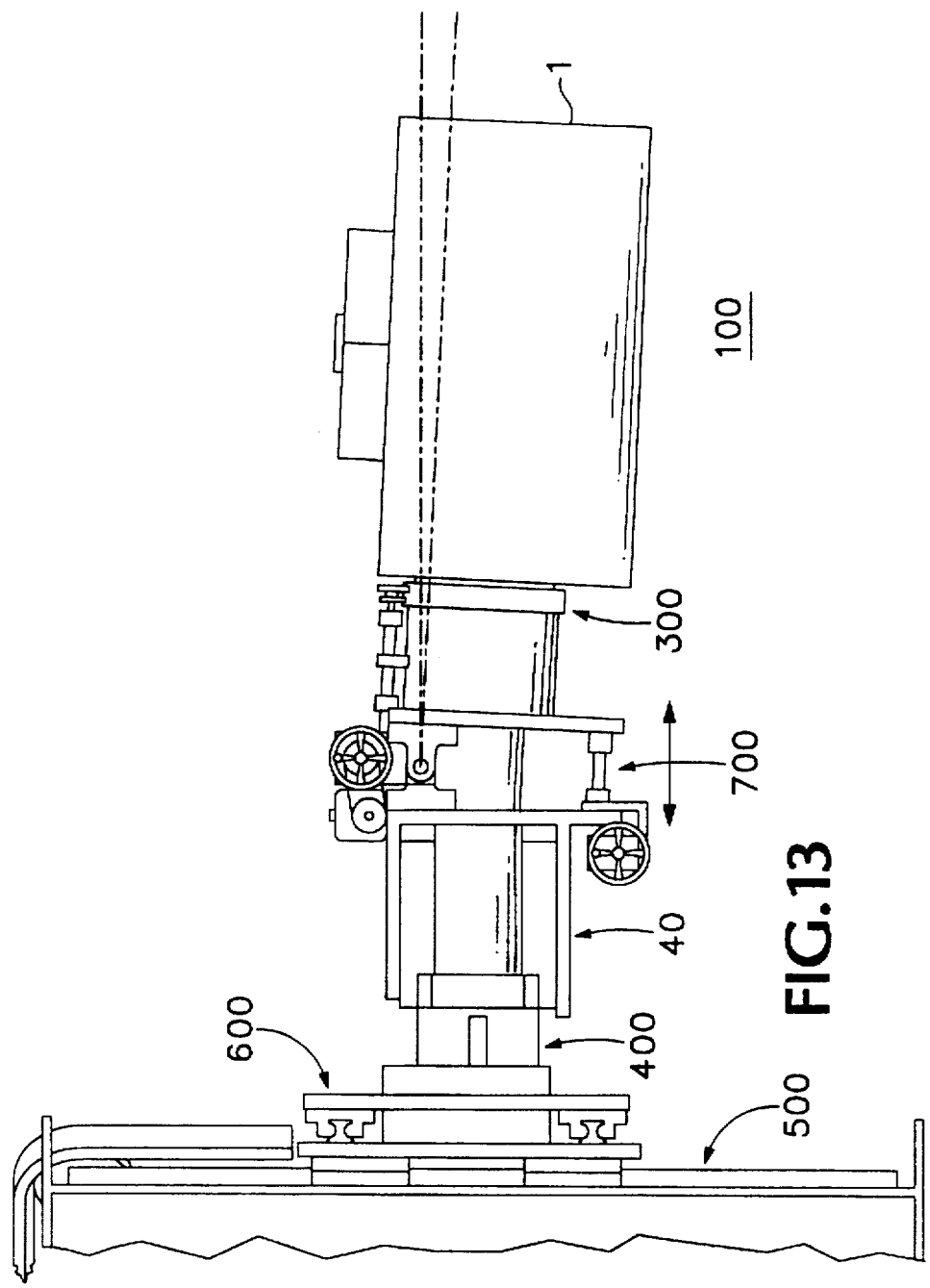
FIG. 13 is a side view illustrating a tester with 2.5 degrees of upward rotation of the tumble assembly in accordance with the present invention.
Figure 14:
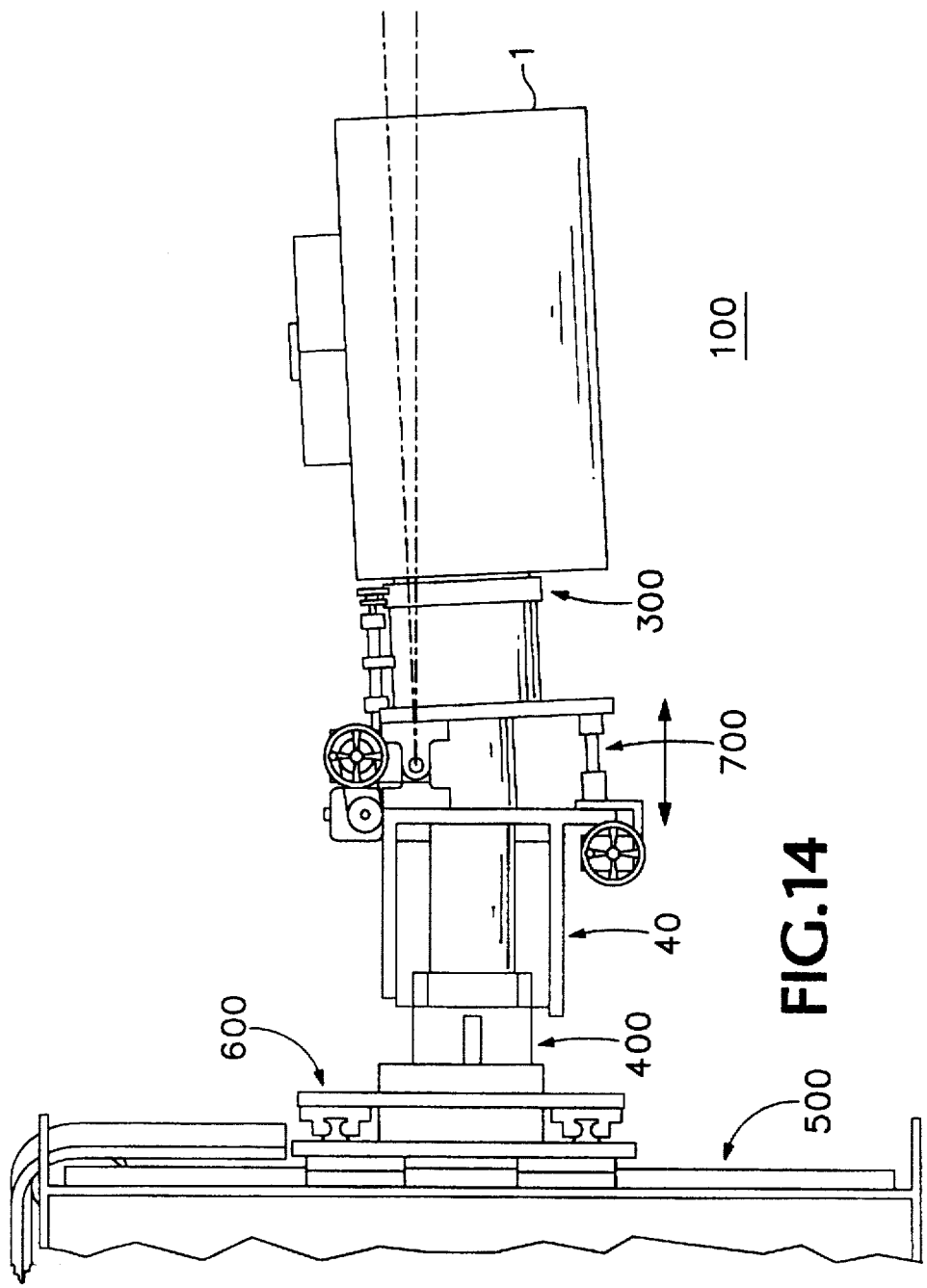
FIG. 14 is a side view illustrating a tester with 2.5 degrees of downward rotation of the tumble assembly in accordance with the present invention.
Figure 15:
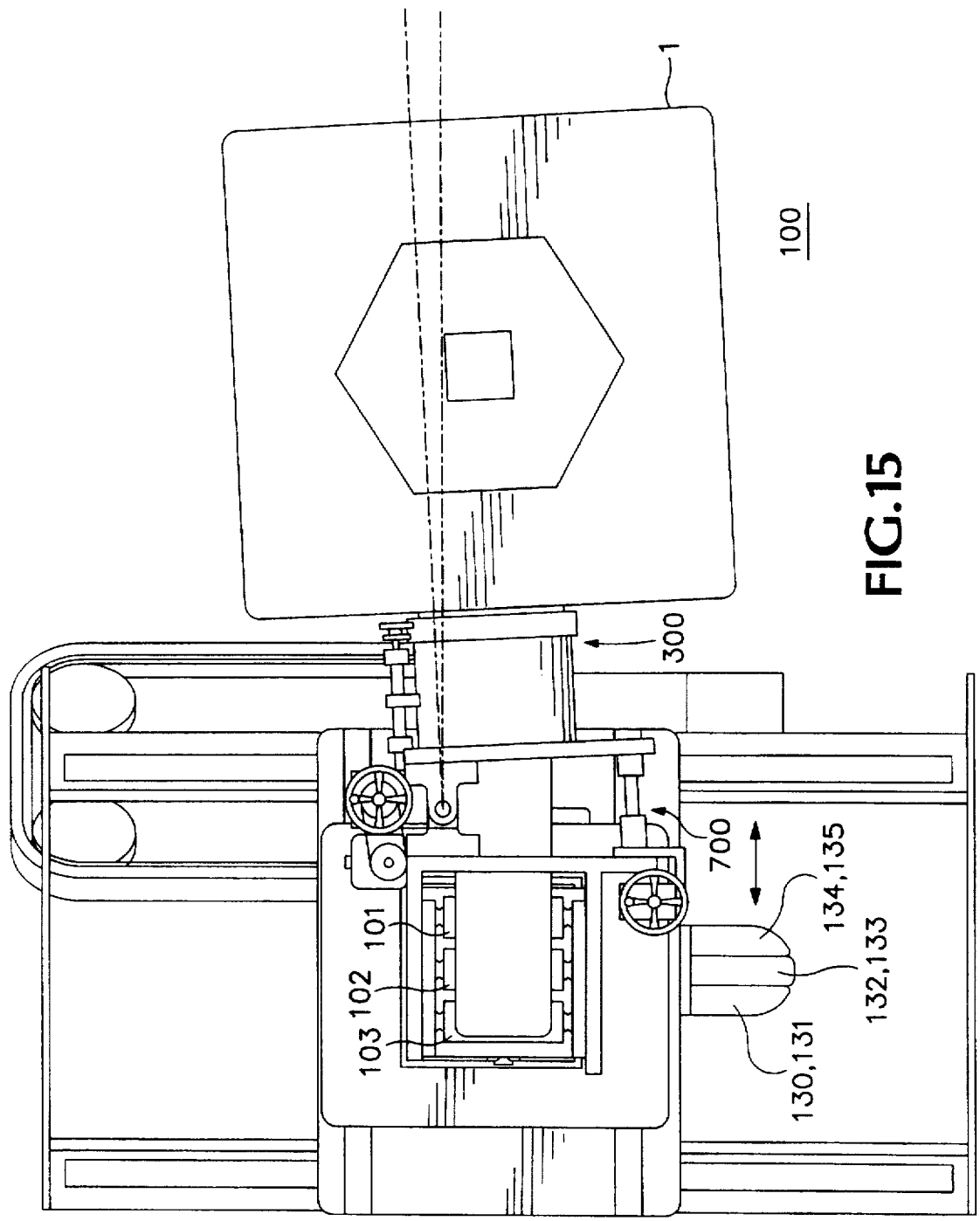
FIG. 15 is a front perspective view illustrating a tester with a manipulator in a DUT side position with a swing arm having 90 degrees of swing rotation to the right side and an expansion joint in the fully expanded position and a rotary bearing assembly having 90 degrees of tumble rotation with 2.5 degrees of upward rotation of the tumble assembly in accordance with the present invention.
Figure 16:
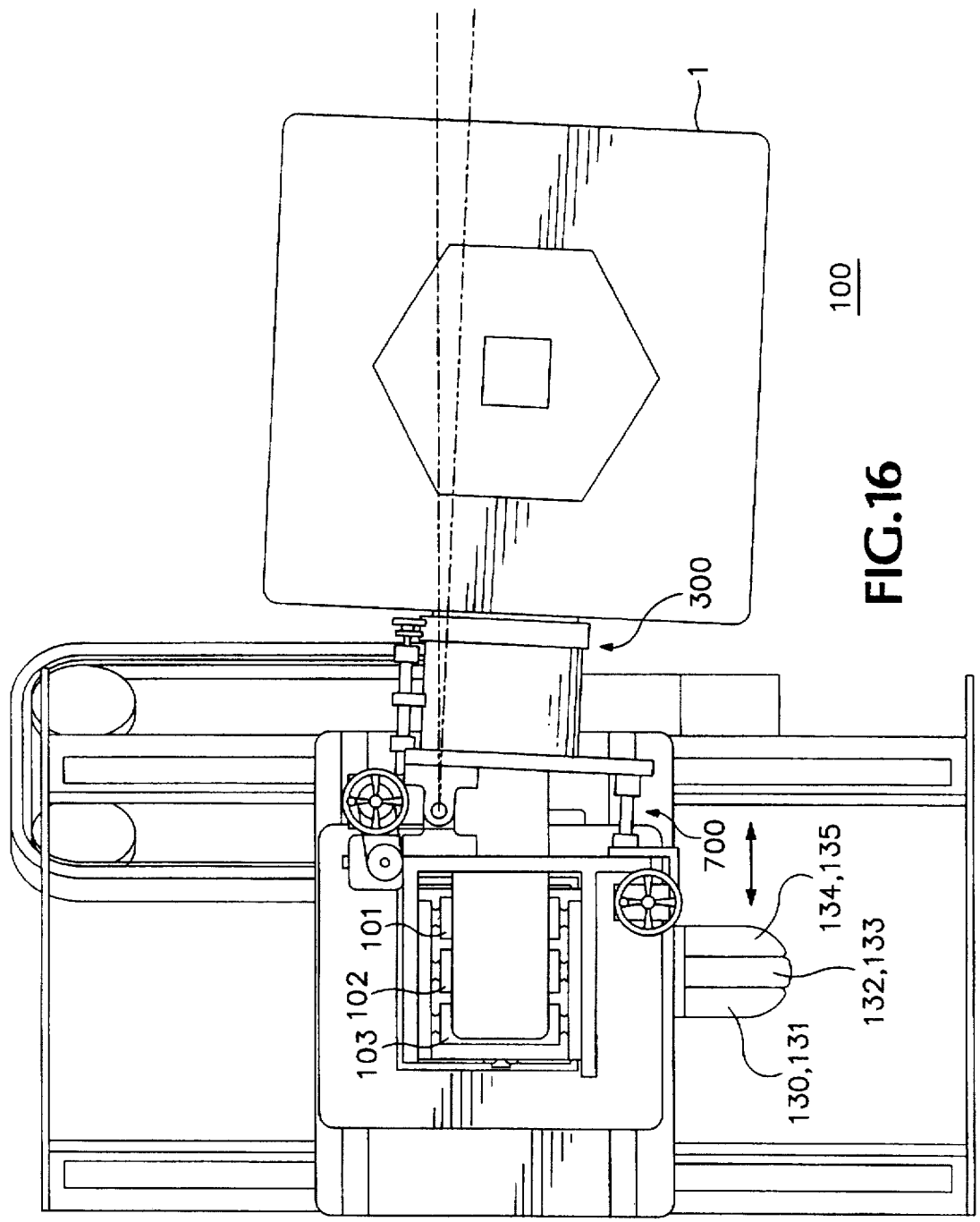
FIG. 16 is a front perspective view illustrating a tester with a manipulator in a DUT side position with a swing arm having 90 degrees of swing rotation to the right side and an expansion joint in the fully expanded position and a rotary bearing assembly having 90 degrees of tumble rotation with 2.5 degrees of downward rotation of the tumble assembly in accordance with the present invention.

Rotation of swing arm 40 constitutes movement along the x axis and along the z axis and changes the movement with respect to the x-y-z coordinate system obtained by movement of tumble assembly 700 and movement of rotary bearing assembly 300. FIGS. 11–12 show the x-y-z axis moved to reflect a new origin of the x-y-z axis which corresponds to the movement of swing arm 40. By moving swing arm 40 into a position with 90 degrees of swing as shown in FIGS. 11–12, rotation of rotary bearing assembly 300 constitutes rotation about the z axis and movement of tumble assembly 700 constitutes rotation around the x axis.

FIG. 11 shows tester 100 in a position suitable for DUT side testing. This DUT side testing position may be obtained by applying 90 degrees of twist rotation to rotary bearing assembly 300 and by swinging swing arm 40 fully to the left such that it is rotated 90 degrees to the left. FIG. 12 shows tester 100 in a position with rotary bearing assembly 300 rotated with 45 degrees of twist rotation and with swing arm 40 rotated 90 degrees to the left.

In FIGS. 11–12, since swing arm 40 is rotated into a position of ninety degrees of rotation, rotation of rotary bearing assembly 300 actually accomplishes tumble rotation (e.g. the same movement possible by moving tumble assembly 700 when swing arm 40 has 0 degrees of swing). Similarly, rotation of tumble assembly 700 actually accomplishes twist rotation (e.g. the same movement possible by moving rotary bearing assembly 300 when swing arm 40 has 0 degrees of swing).

As shown in FIGS. 9–12, tumble motion (rotation about the z axis) may be obtained by motion of either tumble assembly 700 or rotary bearing assembly 300 and twist motion (rotation around the x axis) may be obtained by motion of either tumble assembly 700 or rotary bearing assembly 300. However, irrespective of the movement of swing arm 40, the movement of tumble assembly 700 has a component of its motion which constitutes motion along the y axis. It is this movement along the y axis that allows for full compensation for sag.

Figure 5A:
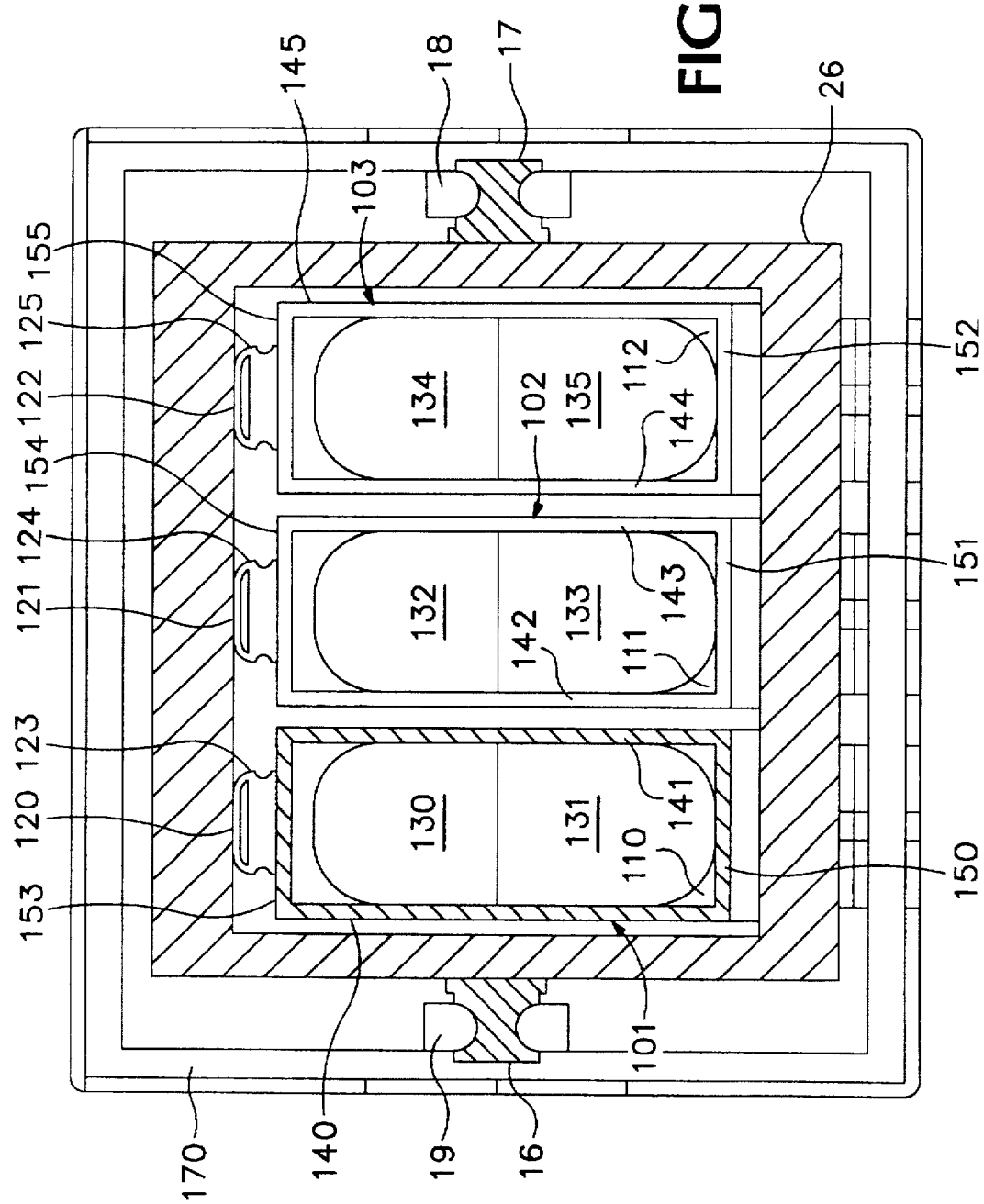
FIG. 5a is a cross sectional view along cross section I—I of FIG. 4 illustrating a tester including cable trays and cable in accordance with the present invention.
Figure 5B:
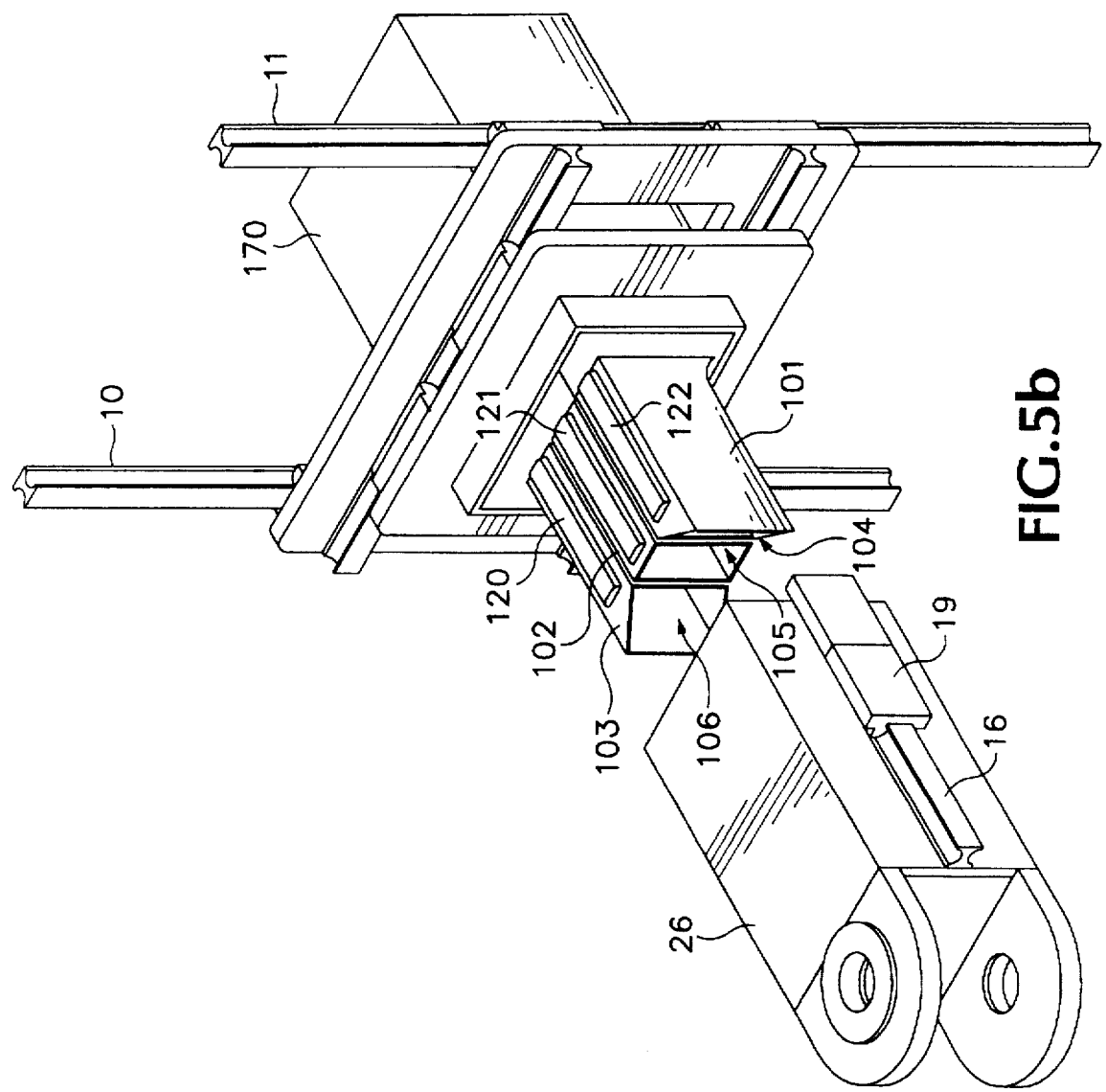
FIG. 5b is an expanded view of cable trays and an expansion joint and horizontal and vertical rail assemblies in accordance with the present invention.

Expansion joint 400 of FIGS. 5a and 5b includes lateral rails 16–17, lateral bearing assemblies 18–19 and cable housing 26. Lateral rail 16 and lateral rail 17 lie on opposite sides of cable housing 26 and are attached to cable housing 26. Lateral bearing assemblies 18–19 are attached to opposite sides of support box 170. Lateral rail 16 engages with lateral bearing assembly 19 so as to allow for the lateral movement of cable housing 26. Similarly, lateral bearing assembly 18 engages lateral rail 17 so as to allow for the lateral movement of cable housing 26.

Contoured flange 110 of FIG. 5a extends from cable tray 101 so as to support cables 130–131. Contoured flange 111 extends from cable tray 102 so as to support cables 132–133. Similarly, contoured flange 112 extends from cable tray 103 so as to support cables 134–135. Contoured flanges 110–112, in addition to supporting cables 130–135, prevent cables 130–135 from being damaged by chafing against cable trays 101–103 as cable trays 101–103 move inward and outward.

Continuing with FIGS. 5a and 5b, cable tray 101 is attached to cable housing 26 by rail 120 and bearing assembly 123 such that cable tray 101 is allowed to move laterally inward and outward within cable housing 26. Cable tray 102 is attached to cable housing 26 by rail 121 and bearing assembly 124 such that cable tray 102 may move laterally within cable housing 26. Similarly, cable tray 103 is attached to cable housing 26 by rail 122 and bearing assembly 125 such that cable tray 103 may move laterally within cable housing 26.

Cable tray 101 of FIGS. 5a and 5b includes top panel 153 and bottom panel 150 and side panels 140–141. The height of side panels 140–141 is greater than the width of top panel 153 and the width of bottom panel 150. Cable tray 102 includes top panel 154 and bottom panel 151 and side panels 142–143. The height of side panels 142–143 is greater than the width of top panel 154 and the width of bottom panel 151. Similarly, cable tray 103 includes top panel 155 and bottom panel 152 and side panels 144–145 and the height of side panels 144–145 is greater than the width of top panel 154 and the width of bottom panel 152. Cable trays 101–103 support cables 130–135 and cables 130–131 are disposed within cable tray 101 and cables 132–133 are disposed in cable tray 102 and cables 134–135 are disposed in cable tray 103. Since cables 130–135 must flex horizontally to accommodate the rotation of swing arm 40 (not shown), cable trays 101–103 are designed to allow for horizontal flexing and rotation. Thus, the height of side panels 140–145 is greater than the width of top panels 153–155 and the width of bottom panels 150–152 such that cables 130–135 are disbursed such that they lie within cable trays 101–103 more vertically than horizontally. Thus, the side profiles of cables 130–135 are reduced, thus allowing cables 130–135 to flex horizontally to the right or to the left with reduced tension and compression on cables 130–135. In addition, the disbursement of cables into cable trays such that cables 130–135 are disposed more vertically than horizontally prevents cables from being bound up thereby allowing the cables to flex more than the range of flex in prior art cable assemblies.

The disbursement of cables into individual cable trays of FIG. 5a is based on the weight of each individual cable and the flexibility of the individual cable. Cables are distributed so as to roughly equalize the weight in each cable tray. Middle cable tray 102 does not move as much as do cable trays 101 and 103; therefore, cables 132–133 which are stiffer and larger and more fragile than the other cables are disposed in cable tray 102 so as to minimize their movement. Though the present invention is described with reference to the use of three cable trays, fewer or more cable trays could also be used. In an embodiment having more than three cable trays, the cables would be more widely disbursed, allowing for increased rotational movement, but adding cost and complexity to the manipulator design.

Figure 6:
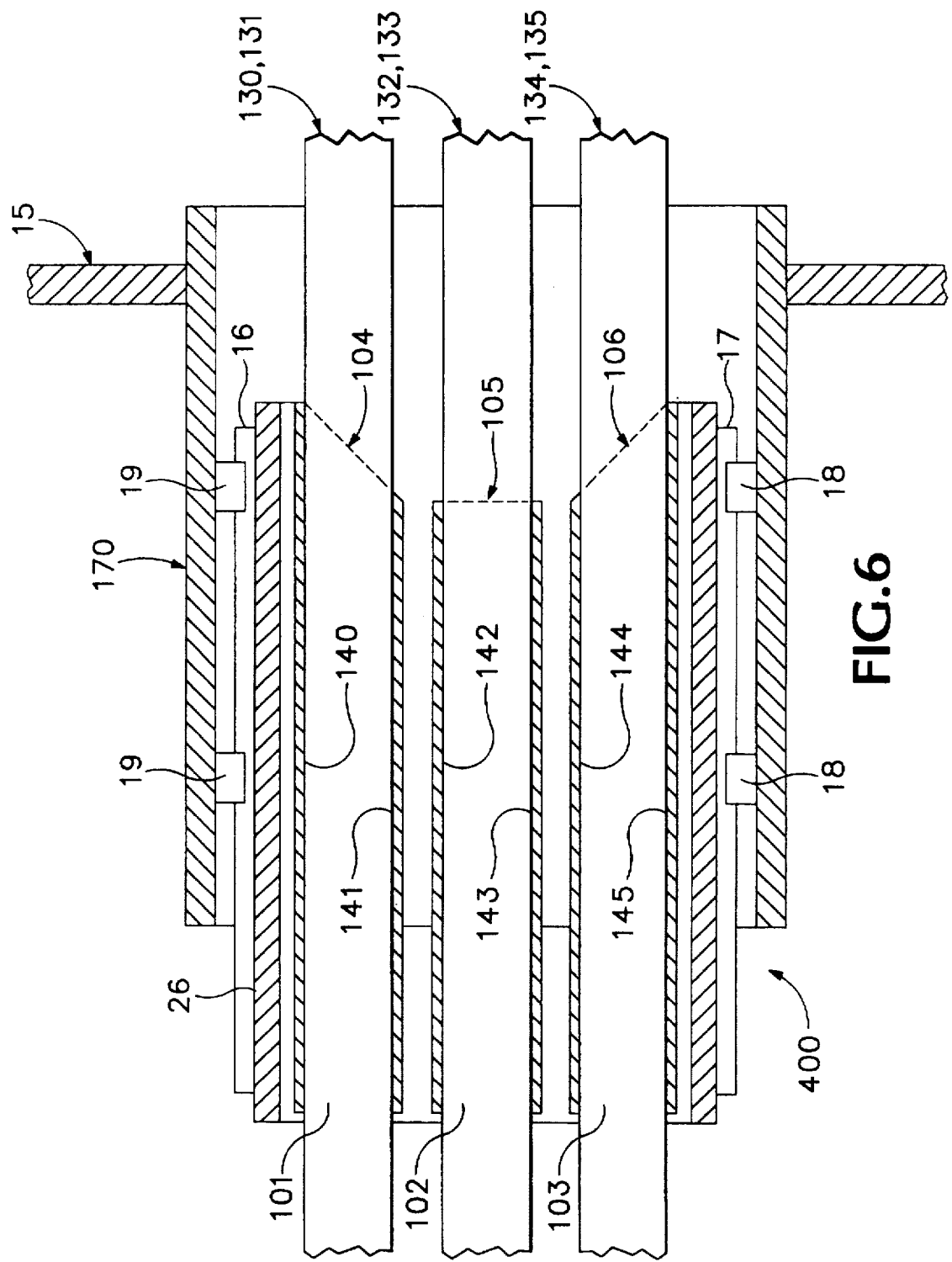
FIG. 6 shows a top cross sectional view along axis C—C of FIG. 4 illustrating an expanded view of a tester including a cable trays and cables with a manipulator in a DUT up position with a swing arm having 0 degrees of swing rotation and an expansion joint in the fully retracted position in accordance with the present invention.

FIG. 6 is a plan cut away view of the cable trays 101–103 of the present invention showing the length of outer side panel 140 to be longer than the length of inner side panel 141 such that front surface 104 of cable tray 101 has an angled profile. Side panels 142–143 have an equal length such that the profile of surface 105 is flat. The length of outer side panel 145 is longer than the length of inner side panel 144 such that front surface 106 of cable tray 101 has an angled profile. The angled profiles of front surfaces 104 and 106 allow for cables 130–131 and 134–135 to flex such that swing arm 40 (not shown) may rotate within a full ninety degree range of motion, the angled profile reducing tension and allowing for cables 130–131 to fully bend without being subject to binding tension from side panels 141 and 144 while providing the maximum cable tray length possible for more cable control.

Figure 7:
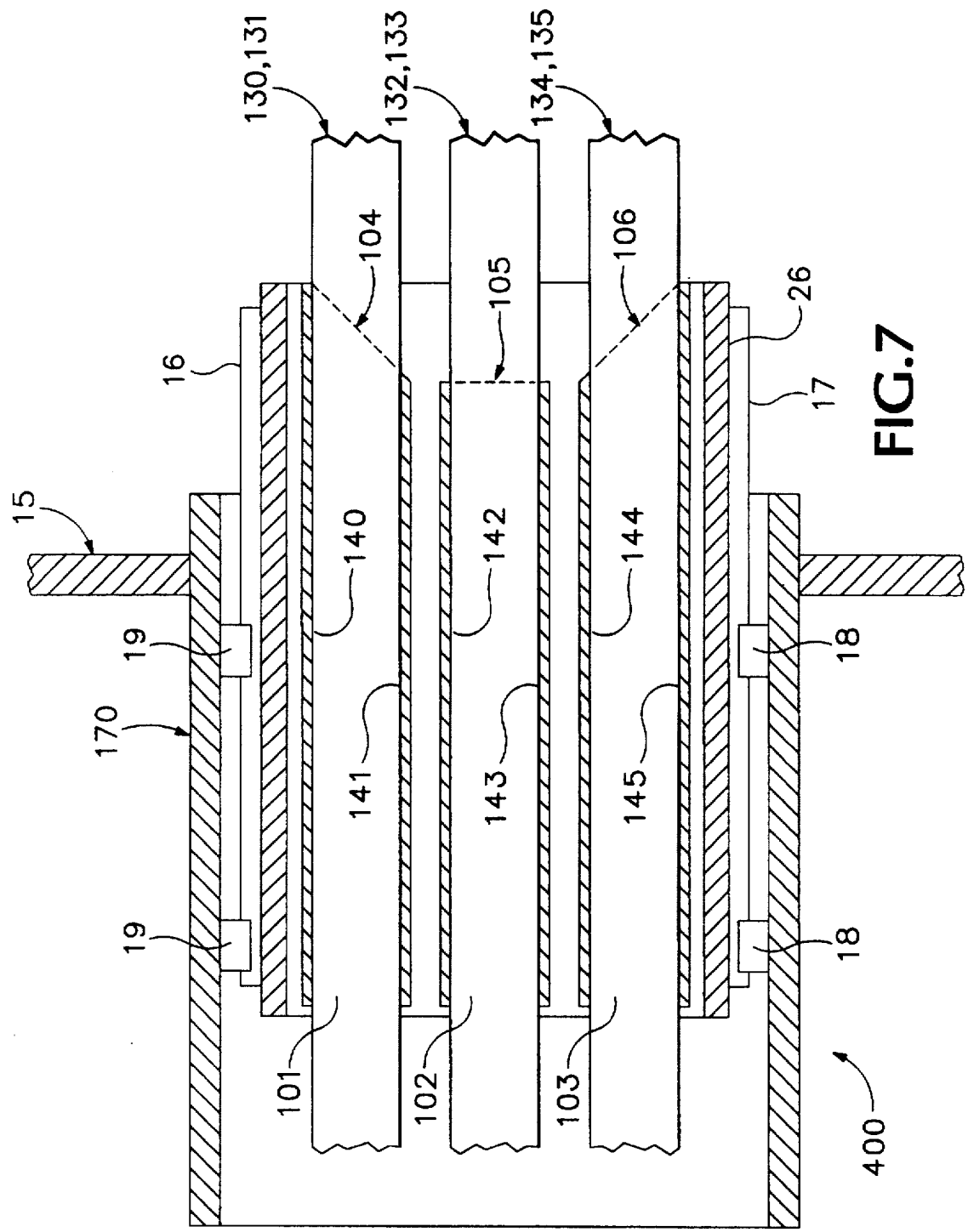
FIG. 7 shows a top cross sectional view along axis C—C of FIG. 4 illustrating an expanded view of a tester including cable trays and cables with a manipulator in a DUT up position with a swing arm having 0 degrees of swing rotation and an expansion joint in the fully expanded position in accordance with the present invention.

FIG. 7 shows the structure of FIG. 6 after the extension of expansion joint 400 into the fully extended position. Cables 130–135 move cable trays 101–103 forward so as to accommodate the movement of expansion joint 400.

Figure 8A:
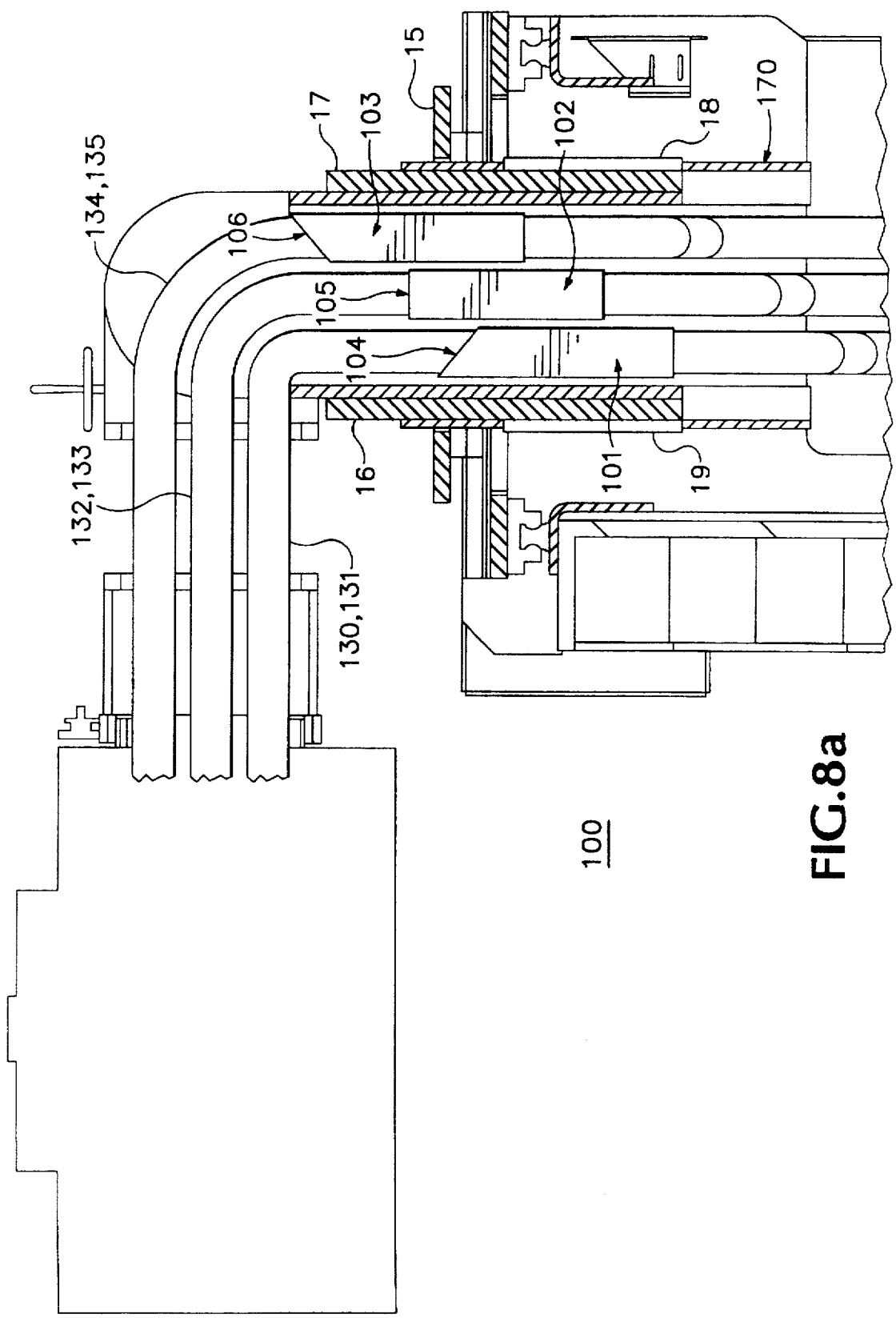
FIG. 8a shows a top cross sectional view along axis C—C of FIG. 4 illustrating an expanded view of a tester including a cable trays and cables with a manipulator in a DUT up position with a swing arm having 90 degrees of swing rotation to the right and an expansion joint in the fully expanded position in accordance with the present invention.

FIG. 8a shows the structure of FIG. 7 after swing arm 40 is moved into a position with 90 degrees of swing to the right. As swing arm 40 moves, cable tray 101 moves backwards to relieve the compression force on cables 130–131 resulting from the flexing of cables 130–131. Similarly, cable tray 102 moves backwards to relieve the compression force on cables 132–133 resulting from the flexing of cables 132–133. As swing arm 40 swings away from cable tray 103, cables 134–135 are placed in tension and cable tray 103 moves forward so as to reduce tension on cables 134–135. The angled profile of front surface 106 allows cables 134–135 to freely bend when swing arm 40 is rotated to the right. Not only does the angled profile of front surface 106 reduce tension in cables 134–135; but also, the angled profile allows for swing arm 40 to move within an expanded range of motion. Due to the reduction in tension and compression in cables 130–135, swing arm 40 may move within an arc of 90 degrees without damage to cables 130–135 and without applying an excessive amount of compression or tension to cables 130–135. In one embodiment, upon a full 90 degree rotation of swing arm 40 to the right, cable tray moves 6.18 inches backwards and cable tray 102 moves backwards a total of 1.96 inches while cable tray 103 moves forward a total of 2.26 inches.

Movement of swing arm 40 into a position with 90 degrees of swing to the left moves cable tray 103 backwards as shown in FIG. 8b, moves cable tray 102 backwards and forwards and moves cable tray 101 forward so as to reduce tension and compression on cables 130–135. The angled profile of front surface 104 allows cables 134–135 to freely bend when swing arm 40 is rotated to the left.

FIG. 8c shows an expanded side profile of cable trays 101–103 when swing arm 40 is moved into a position with 90 degrees of swing to the left. Contoured flange 110 (not shown) is formed in cable tray 101 so as to support cables 130–131. Contoured flange 111 (not shown) is formed within cable tray 102 so as to support cables 132–133. Similarly, contoured flange 112 is formed within cable tray 103 so as to support cables 134–135. Contoured flanges 110–112, in addition to supporting cables 130–135, prevent cables 130–135 from being damaged by chafing against cable trays 101–103 as cable trays 101–103 move back and forth.

FIGS. 13–16 show movement of tumble assembly 700 up and down. This movement allows for the full compensation for sag. Thus, the present invention allows for the movement of test head into a full range of positions. The component systems work together to give smooth motion and easy control of the head such that testing may be accomplished for DUT up, DUT down and DUT forward using the same tester. Therefore, no expensive and time consuming modifications are necessary to accommodate different testing conditions. In addition, there is no yoke obstructing and limiting the movement of the test head. Moreover, by allowing for a full range of sag motion, the present invention allows for testing in situations where prior art testers cannot compensate for sag.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A cable handling system for handling a cables of tester, said tester including a frame, a manipulator, and a testing head coupled to said cables, said cable handling system comprising:

a cable housing having a length and connected to said frame;

a first rail attached to said cable housing such that said first rail extends longitudinally across said length of said cable housing;

a first bearing assembly attached to said first rail such that said first bearing assembly slides longitudinally along said first rail; and a first cable tray attached to said first bearing assembly such that said first cable tray slides longitudinally within said cable housing in and out along said length of said cable housing, said first cable tray for receiving a first portion of said cables such that said first portion of said cables is supported by said first cable tray, wherein said first cable tray slides in and out longitudinally in response to movement of said first portion of said cables so as to remove compression and tension in said first portion of said cables as said first portion is flexed in one direction and another in response to movement of said manipulator.

2. The cable handling system of claim 1 wherein said first cable tray has a first end and a second end and wherein said first portion of said cables is connected to said frame at a connection point such that when said manipulator is fully retracted, said first portion of said cables forms a loop extending from said first end of said first cable tray to said connection point, said first cable tray comprising a contoured flange, said contoured flange formed within said first end of said first cable tray and for supporting and preventing chafing of said first portion of said cables.

3. The cable handling system of claim 1 further comprising:

a second rail disposed adjacent to said first rail and attached to said cable housing such that said second rail extends longitudinally across said length of said cable housing;

a second bearing assembly connected to said second rail such that said second bearing assembly slides longitudinally along said second rail; and a second cable tray connected to said second bearing assembly such that said second cable tray slides longitudinally within said cable housing in and out along said length of said cable housing, said second cable try for receiving a second portion of said cables, wherein said second cable tray slides in and out longitudinally, independently of said first cable tray, in response to movement of said second portion of said cables so as to remove compression and tension in said second portion of said cables as said second portion is flexed in one direction and another in response to movement of said manipulator.

4. The cable handling system of claim 3 further comprising:

a third rail disposed adjacent to said second rail and attached to said cable housing such that said third rail extends longitudinally across said length of said cable housing;

a third bearing assembly connected to said third rail such that said third bearing assembly slides longitudinally along said third rail; and a third cable tray connected to said third bearing assembly such that said third cable tray slides longitudinally within said cable housing in and out along said length of said cable housing, said third cable try for receiving a third portion of said cables, wherein said third cable tray slides in and out longitudinally, independently of said first and second cable trays, in response to movement of said third portion of said cables so as to remove compression and tension in said third portion of said cables as said third portion is flexed in one direction and another in response to movement of said manipulator.

5. The cable handling system of claim 4 wherein said second cable tray and said third cable tray have respective first end and second ends, and wherein said second and third portions of said cables are connected to said frame at connection points such that when said manipulator is fully retracted, said second and third portions of said cables form a loop extending from said first ends of said second and third cable trays to said connection points, said second and third cable trays each having a contoured flange, extending from said first end of said second and third cable trays, for supporting and preventing chafing of said second and third portions of said cables, respectively.

6. The cable handling system of claim 4 wherein said first cable tray is rectangular in shape and further comprises an outer side, an inner side, a top side and a bottom side, said outer side and said inner side having a height, said top side and said bottom side having a width, wherein said height is greater than said width such that said first portion of said cables is disposed more vertically than horizontally within said first cable tray to reduce stress and compression on said first portion of said cables when said cables is flexed about an axis parallel to said height.

7. The cable handling system of claim 6 wherein:

said second cable tray is rectangular in shape and comprises a first inner side, a second inner side, a top side and a bottom side, said first inner side and said second inner side having a height, said top side and said bottom side having a width, wherein said height is greater than said width such that said second portion of said cables is disposed more vertically than horizontally in said second cable tray to reduce stress and compression on said second portion of said cables when said cables are flexed about said axis; and wherein said third cable tray is rectangular in shape and comprises an outer side, an inner side, a top side and a bottom side, said outer side and said inner side having a height, said top side and said bottom side having a width, wherein said height is greater than said width such that said third portion of said cables is disposed more vertically than horizontally in said third cable tray so as to reduce stress and compression on said third portion of said cables when said cables are flexed about said axis.

8. The cable handling system of claim 6 wherein said outer side and said inner side have respective lengths and wherein said length of said outer side of said first cable tray is greater than said length of said inner side of said first cable tray such that said inner side of said first cable tray does not restrict movement of said first portion of said cables when said first portion of said cables is flexed about said axis in a direction away from said outer side of said first cable tray.

9. The cable handling system of claim 8 wherein:

said first side and said second side of said second cable tray have respective lengths and wherein said length of said first side of said second cable tray is equal to said length of said second side of said second cable tray; and wherein said outer side and said inner side of said third cable tray have respective lengths and wherein said length of said outer side of said third cable tray is greater than said length of said inner side of said third cable tray such that said inner side of said third cable tray does not restrict the movement of said third portion of said cables when said cables are flexed about said axis in a direction away from said outer side of said third cable tray.

10. A cable handling system for a manipulator including cables connected between a frame and a testing head, said cable handling system comprising:

a cable housing coupled to said frame;

a plurality of rails disposed longitudinally on a bottom surface of said cable housing;

a plurality of bearing assemblies connected to said plurality of rails such that said respective bearing assemblies are allowed to slide longitudinally along respective rails; and a plurality of cable trays for receiving and supporting said cables, respective cable trays being disposed within said cable housing and connected to respective bearing assemblies such that said plurality of cable trays are allowed to move longitudinally within said cable housing, wherein said cable trays independently slide in and out longitudinally with respect to said cable housing in response to movement of said cables to remove compression and tension in said cables as said cables are flexed in one direction and another in response to movement of said manipulator.

11. The cable handling system as described in claim 10 wherein said plurality of cable trays comprise:

a first outer cable tray disposed on a first side of said cable housing;

a second outer cable tray disposed on a second side of said cable housing, opposite said first side; and a middle cable tray disposed in between said first and said second outer cable trays.

12. The cable handling system as described in claim 11 wherein said first outer cable tray slides inward and said second outer cable tray slides outward when said cables are flexed in a direction toward said first outer cable tray to relieve tension in cables within said second outer cable tray and to relieve compression in cables in said first outer cable tray.

13. The cable handling system as described in claim 12 wherein said first outer cable tray slides outward and said second outer cable tray slides inward when said cables are flexed in a direction toward said second outer cable tray to relieve tension in cables within said first outer cable tray and to relieve compression in cables in said second outer cable tray.

14. The cable handling system of claim 10 wherein each cable tray of said plurality of cable trays includes a respective first end, a respective second end and a respective bottom side, said respective bottom side at said respective first end including a contoured flange on each cable tray for supporting said cables and preventing chafing of said cables against each cable tray.

15. The cable handling system of claim 14 wherein said contoured flange of each cable tray extends past said cable housing such that said cables extend from said contoured flange and form a loop of slack cable between said frame and said contoured flange, said loop of slack cable decreasing and increasing in size as said manipulator is extended and retracted with respect to said frame.

16. The cable handling system of claim 10 wherein said cable housing is attached within an expansion joint of said manipulator and wherein said cables pass through said manipulator from said frame to said testing head.

17. The cable handling system of claim 10 wherein each of said plurality of cable trays has a respective top having a width, a respective bottom having a width, and respective sides having a height, said height being greater than said width such that said plurality of cables are disposed more vertically than horizontally within each cable tray so as to reduce stress and compression on said cables when said cables are flexed about an axis parallel to said height.

18. The cable handling system of claim 10 wherein said plurality of bearing assemblies comprise Accu-Glide bearings.

19. A manipulator for positioning a testing head, said manipulator comprising:

an expansion joint mounted on a frame and movable vertically and horizontally within a plane and movable orthogonal to said plane between a fully extended position and a retracted position;

a swing arm having a first end, a second end and a longitudinal axis, said first end pivotally connected to said expansion joint allowing said swing arm to swing about a first axis;

a rotary bearing assembly connected between said testing head and said swing arm, said rotary bearing assembly allowing for the rotation of said testing head about a second axis running through the center of said rotary bearing assembly;

cables coupled to said testing head and to said frame, said cables running through said expansion joint, through said swing arm and through said rotary bearing assembly; and a plurality of cable trays disposed within said expansion joint, said plurality of cable trays for receiving and supporting said cables, respective cable trays being disposed within a cable housing and connected to respective bearing assemblies such that said plurality of cable trays are allowed to move longitudinally within said cable housing, wherein said cable trays independently slide in and out longitudinally with respect to said cable housing in response to movement of said cables to remove compression and tension in said cables as said cables are flexed in one direction and another in response to movement of said testing head.

20. The manipulator as described in claim 19 wherein said plurality of cable trays comprise:

a first outer cable tray disposed on a first side of said cable housing;

a second outer cable tray disposed on a second side of said cable housing, opposite said first side; and a middle cable tray disposed in between said first and said second outer cable trays.

21. The manipulator as described in claim 20 wherein said first outer cable tray slides inward and said second outer cable tray slides outward when said cables are flexed in a direction toward said first outer cable tray and wherein said first outer cable tray slides outward and said second outer cable tray slides inward when said cables are flexed in a direction toward said second outer cable tray.

22. The manipulator of claim 19 wherein each cable tray of said plurality of cable trays includes a respective first end, a respective second end and a respective bottom side, said respective bottom side at said respective first end including a contoured flange on each cable tray for supporting said cables so as to prevent chafing of said cables against each cable tray.

23. The manipulator of claim 22 wherein said contoured flange of each cable tray extends past said cable housing such that said cables extend from said contoured flange and form a loop of slack cable between said frame and said contoured flange, said loop of slack cable decreasing and increasing in size as said manipulator is extended and retracted with respect to said frame.

24. The manipulator of claim 19 wherein each of said plurality of cable trays has a respective top having a width, a respective bottom having a width, and respective sides having a height, said height being greater than said width such that said plurality of cables are disposed more vertically than horizontally within each cable tray so as to reduce stress and compression on said cables when said cables are flexed about an axis parallel to said height.

* * * * *